United States Patent
Zushi et al.

(10) Patent No.: US 7,415,343 B2
(45) Date of Patent: Aug. 19, 2008

(54) ENGINE CONTROLLER

(75) Inventors: Yuji Zushi, Chiyoda-ku (JP); Toru Tanaka, Chiyoda-ku (JP); Michihisa Yokono, Kobe (JP); Akihiro Fukui, Kobe (JP); Yusuke Matsuda, Chiyoda-Ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 54 days.

(21) Appl. No.: 11/797,572

(22) Filed: May 4, 2007

(65) Prior Publication Data

US 2008/0077303 A1   Mar. 27, 2008

(30) Foreign Application Priority Data

Sep. 25, 2006   (JP)   ............................ 2006-258942

(51) Int. Cl.
  *F02D 45/00*   (2006.01)
  *G06F 19/00*   (2006.01)
(52) U.S. Cl. ...................... 701/101; 73/23.32; 701/115
(58) Field of Classification Search .................. 701/101, 701/102, 108, 109, 115; 73/23.32; 204/401; 60/276, 285
See application file for complete search history.

(56) References Cited

U.S. PATENT DOCUMENTS 4,825,838 A * 5/1989 Osuga et al. ................ 123/681
6,957,562 B2 * 10/2005 Anilovich et al. ............ 73/1.06

FOREIGN PATENT DOCUMENTS

| JP | 5-107299 A | 4/1993 |
| JP | 2001-173496 A * | 6/2001 |
| JP | 2005-171898 A | 6/2005 |

* cited by examiner

*Primary Examiner*—Hieu T. Vo
(74) *Attorney, Agent, or Firm*—Sughrue Mion, PLLC

(57) ABSTRACT

Respective positive terminal electric potentials of exhaust gas sensors are sequentially selectively inputted to an analog input terminal of a multi-channel AD converter through a multiplexer. An offset voltage is applied to respective negative terminals of the exhaust gas sensors. This offset voltage is inputted to another input terminal of the multi-channel AD converter. A microprocessor detects a generating voltage of the exhaust gas sensors by the difference between a digital converting value of the positive terminal electric potential and a digital converting value of the negative terminal electric potential. The microprocessor also individually judges that each of the digital converting values is excessively small and excessively large. Thus, the microprocessor judges the existence of ground, sky short circuit and disconnection abnormalities of the negative terminal and the positive terminal.

8 Claims, 12 Drawing Sheets

ENGINE CONTROLLER

BACKGROUND OF THE INVENTION

1. Field of the Invention

This invention relates to an engine controller for feeding-back and controlling an air fuel ratio of an internal combustion engine, and particularly relates to an improvement of an abnormality diagnosing device built-in and used in the engine controller, and detecting a breakdown and a wiring abnormality of an exhaust gas sensor externally connected to detect the air fuel ratio and annunciating the abnormality.

2. Background Art

The exhaust gas sensor called a lambda type as a popular name to feed-back and control the air fuel ratio of the internal combustion engine, is widely practically used. For example, this lambda type exhaust gas sensor is arranged before and after a catalyst arranged in an exhaust pipe path, and generates a detecting voltage Vs according to oxygen concentration within exhaust gas. This detecting voltage Vs is about 0.45 V in a theoretical air fuel ratio as a driving target. However, this detecting voltage Vs has characteristics in which this detecting voltage is rapidly raised in a rich state of fuel, and is converged to a value of 0.85 to 1.0 V, and is rapidly lowered in a lean state of the fuel and is converged to 0.1 to 0 V.

However, it is general that the detecting voltage in a low temperature and non-activating state of this exhaust gas sensor is small, and internal resistance reaches a level of several MΩ although the internal resistance is several ten KΩ in an activating temperature state. Various techniques are proposed and practically used to detect the breakdown and the wiring abnormality of such an exhaust gas sensor.

For example, in accordance with JP-A-05-107299 "Connecting circuit for lambda sensor and inspecting method of this circuit", an offset voltage is applied to a ground lead (negative line) of the lambda sensor for detecting the air fuel ratio. The detecting voltage generated between a positive signal line and the negative line of the lambda sensor is amplified. A value provided by adding the above offset voltage is digitally converted and is then inputted to a microprocessor. If the detecting voltage inputted to the microprocessor is a value less than the above offset voltage, it is judged as a ground state in which the positive signal line comes in short circuit contact with a ground circuit. Further, it is detected as a ground abnormality at a disconnection abnormality time of the signal line by connecting a pull-down resistor to the positive signal line.

Further, in accordance with JP-A-2005-171898 "breakdown diagnosing device and breakdown diagnosing method of air fuel ratio sensor", the offset voltage is applied to the negative line of the air fuel ratio sensor. An electric potential of the positive signal line of the air fuel ratio sensor with respect to the ground circuit is digitally converted and is then inputted to the microprocessor. If the detecting voltage inputted to the microprocessor is a value less than the above offset voltage, it is judged as a ground state in which the positive signal line comes in short circuit contact with the ground circuit.

Further, the pull-down resistor is connected to the positive signal line, and it is possible to discriminate whether it is a ground abnormality or a disconnection abnormality by temporarily connecting a pull-up resistor.

Explanation of Problem of Former Technique

In accordance with the above JP-A-05-107299 and JP-A-2005-171898, the offset voltage is applied to the negative line of the exhaust gas sensor. Thus, if the exhaust gas sensor and its wiring are normal, an abnormality judgment relative to the positive signal line is made by logic in which no electric potential of the positive signal line becomes the above offset voltage or less.

However, a ground abnormality of the ground line (negative line) applying the offset voltage thereto, and a sky short circuit abnormality for coming in mixing contact with an electric power source line are not detected. Accordingly, there is a defect in which no abnormality judgment is synthetically made.

SUMMARY OF THE INVENTION

A first object of this invention is to provide an engine controller in which plural exhaust gas sensors are externally connected and the offset voltage is applied to negative terminal wiring, and the existence of a breakdown of each exhaust gas sensor and an abnormality of input wiring is always inspected and various abnormality modes can be detected without missing.

A second object of this invention is to provide an engine controller able to continue detection of the exhaust gas and a normal operation of the feedback control if no other abnormalities are overlapped and generated when the ground abnormality that the negative terminal wiring applying the offset voltage thereto comes in mixing contact with the ground circuit is generated.

The engine electronic controller in this invention has a microprocessor for controlling the operations of various kinds of electric loads for operating an internal combustion engine in accordance with operating states of various kinds of input sensors for monitoring an operating state of the internal combustion engine, and the contents of a control program stored to a program memory. The above various kinds of input sensors include plural exhaust gas sensors. Each of the exhaust gas sensors has an equivalent voltage source and an equivalent internal resistor connected between a pair of positive and negative terminals. A generating voltage Vs of the equivalent voltage source is changed from a minimum value V0 to a maximum value Vm with a theoretical air fuel ratio as a boundary at a predetermined activating temperature.

A predetermined offset voltage V1 generated by an offset voltage generating circuit is applied to each of the negative terminals of the plural exhaust gas sensors. A negative terminal electric potential as a voltage between the negative terminal and a ground circuit is digitally converted through a multi-channel AD converter, and is stored to a RAM memory for arithmetic processing through the microprocessor.

At least one of a pull-down resistor and a pull-up resistor of high resistance connected to the ground circuit, and a bias resistor of high resistance for giving a predetermined bias electric potential is connected to each of the positive terminals of the plural exhaust gas sensors. A positive terminal electric potential as a voltage between the positive terminal and the ground circuit is respectively converted individually digitally through the multi-channel AD converter, and is stored to the RAM memory for arithmetic processing through the microprocessor.

The program memory includes at least a program as first and second abnormality diagnosing means, and a program as a positive terminal abnormality judgment avoiding means.

The first abnormality diagnosing means is a means for judging that it is a sky short circuit abnormality for making negative terminal wiring come in mixing contact with an electric power source line, or a ground abnormality for making the negative terminal wiring come in mixing contact with a ground line according to whether a digital converting value D1 of the negative terminal electric potential is excessively large or excessively small with a value proportional to the offset voltage V1 as a reference.

The second abnormality diagnosing means is a means for judging that it is a sky short circuit abnormality for making positive terminal wiring come in mixing contact with the electric power source line, or a ground abnormality for making the positive terminal wiring come in mixing contact with the ground line according to whether a digital converting value D2 of the positive terminal electric potential is excessively large with a value proportional to an adding value V1+Vm of the offset voltage V1 and a maximum detecting voltage Vm as a reference, or is excessively small with the value proportional to the offset voltage V1 as a reference; and the second abnormality diagnosing means judges a disconnection abnormality as the ground abnormality or the sky short circuit abnormality when the disconnection abnormality is generated.

The microprocessor obtains a digital converting value proportional to a generating voltage Vs of the exhaust gas sensor by a differential arithmetic calculation of the digital converting value D2 of the positive terminal electric potential and the digital converting value D1 of the negative terminal electric potential, and performs abnormality annunciation according to a diagnosing result using the first and second abnormality diagnosing means.

The positive terminal abnormality judgment avoiding means is a means for judging no ground abnormality of the positive terminal wiring using the second abnormality diagnosing means and considering the differential arithmetic calculation of the microprocessor to be valid when the first abnormality diagnosing means detects the ground abnormality of at least the negative terminal wiring.

In accordance with the engine controller in this invention, the existence of sky short circuit, ground and disconnection abnormalities can be reliably judged by individually judging abnormalities of wiring of the positive terminal side and wiring of the negative terminal side of the exhaust gas sensor. Further, even when the ground abnormality of the negative terminal wiring is generated, a normal operation can be continued if no other abnormalities are overlapped and generated. Accordingly, there is an effect able to foreknow generation of an obstacle by annunciating this state as an abnormality and promoting maintenance inspection.

The foregoing and other object, features, aspects, and advantages of the present invention will become more apparent from the following detailed description of the present invention when taken in conjunction with the accompanying drawings.

DESCRIPTION OF THE PREFERRED EMBODIMENTS

Embodiment Mode 1 of the Invention (1) Detailed Explanation of Construction

Figure 1:
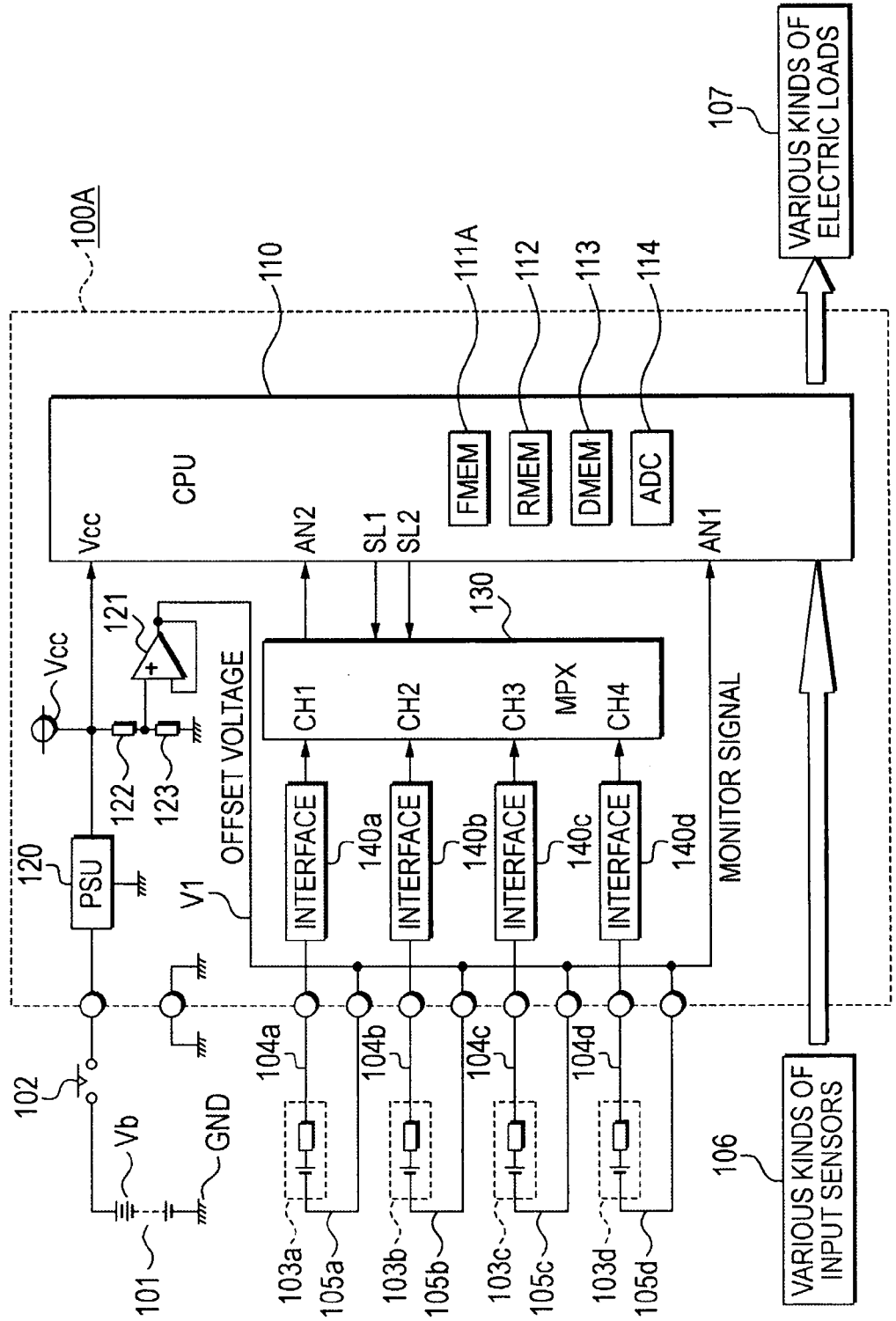
FIG. 1 is a circuit block diagram of a first embodiment device of this invention.

FIG. 1 showing a circuit block diagram of a first embodiment device of this invention will next be explained. In FIG. 1, a vehicle mounting battery 101 is connected between a positive side electricity supply terminal and a negative side electricity supply terminal of an engine controller 100A through an output contact 102 of an electric power source relay.

The output contact 102 is immediately closed when an unillustrated electric power source switch is closed. However, even when the electric power source switch is opened, a delay returning operation for continuing electric supply to the engine controller 100A for a predetermined delay time is performed.

Plural exhaust gas sensors 103a to 103d are arranged in the exterior of the engine controller 100A. Positive terminals of the respective exhaust gas sensors are connected to the engine controller 100A by positive wirings 104a to 104d. Negative terminals of the respective exhaust gas sensors are connected to the engine controller 100A by negative wirings 105a to 105d.

Signals of various kinds of input sensors 106 are inputted to a microprocessor 110 described later through an unillustrated interface circuit. For example, the various kinds of input sensors 106 are set to various kinds of sensors for monitoring an operating situation of the engine such as an air flow sensor for measuring an intake air amount of the engine, an accelerator position sensor for detecting a stepping-in degree of an accelerator pedal, a throttle position sensor for detecting a throttle valve aperture, a crank angle sensor of the engine, etc.

Various kinds of electric loads 107 are supplied in electricity and operated from the microprocessor 110 described later through the unillustrated interface circuit. For example, there are an electromagnetic coil for operating a fuel injection valve, an ignition coil of the engine, a motor for controlling the valve aperture of an intake air throttle, a motor for operating an exhaust circulating valve, an alarm indicator, etc. in the various kinds of electric loads 107.

The microprocessor 110 is mutually bus-connected to a program memory 111A as e.g., a nonvolatile flash memory, a RAM memory 112 for arithmetic processing, a data memory 113 as e.g., a nonvolatile EEPROM memory, and a multi-channel AD converter 114 so as to be cooperated therewith as the internal construction of the engine controller 100A.

Figure 3:
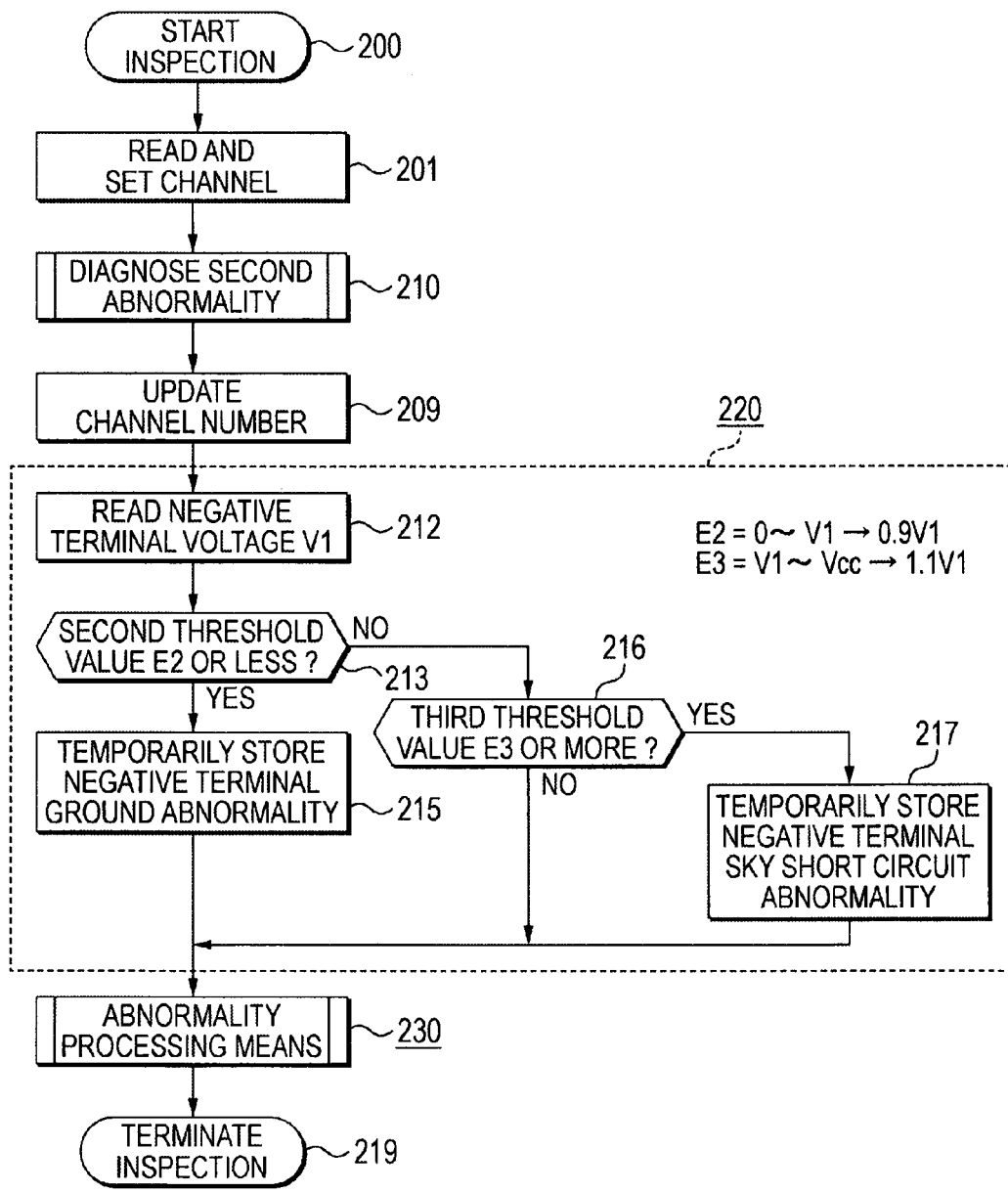
FIG. 3 is a flow chart for explaining an inspecting operation of FIG. 1.
Figure 4:
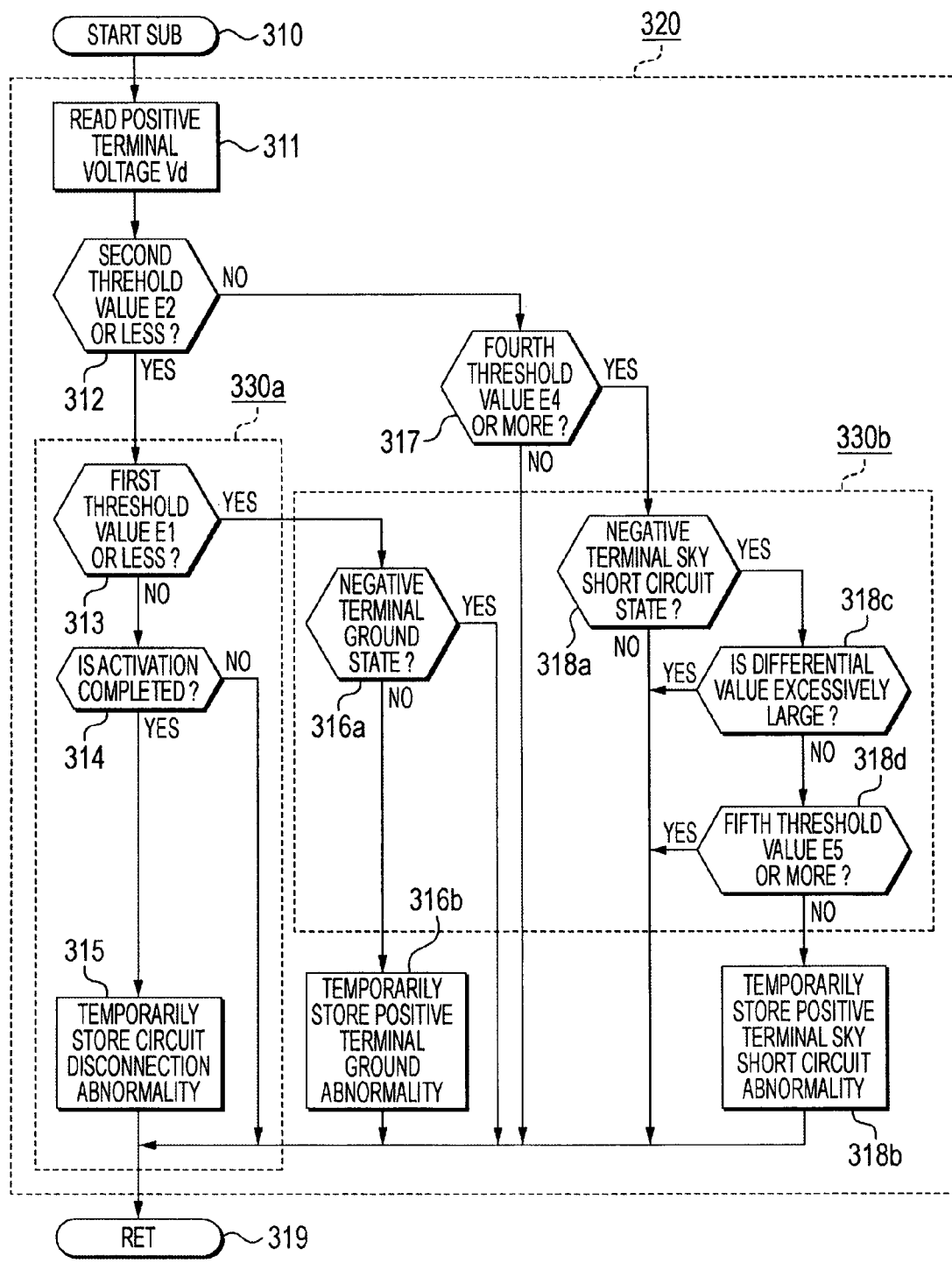
FIG. 4 is a flow chart for explaining an operation relative to a second abnormality diagnosis in FIG. 3.
Figure 5:
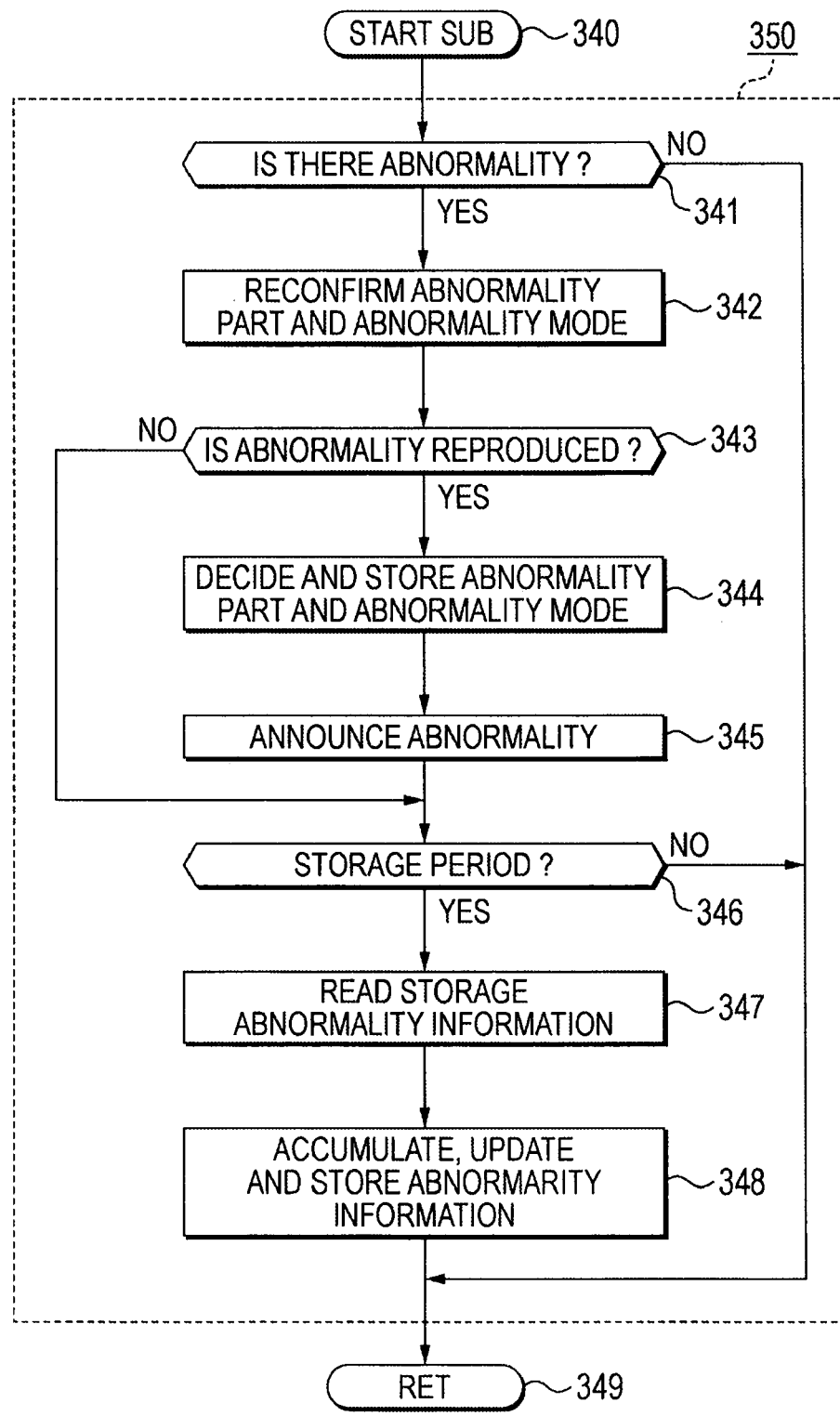
FIG. 5 is a flow chart for explaining an operation relative to an abnormality processing means in FIG. 3.

Programs as various kinds of abnormality diagnosing means and abnormality processing means described later in FIGS. 3 to 5 are stored to the program memory 111A in addition to an input-output control program as the engine controller 100A. A constant voltage electric power source circuit 120 generates a control voltage Vcc=5V on the basis of an electric power source voltage DC6 to 16V of the vehicle mounting battery 101 supplied to a positive electric power source terminal Vb, and supplies a stabilizing voltage to each portion such as the microprocessor 110 described later.

Voltage dividing resistors 122, 123 divide the control electric power source voltage Vcc, and generate an offset voltage V1 of e.g., 0.5V, and apply the offset voltage V1 to negative wirings 105a to 105d through an offset voltage generating circuit 121 as an arithmetic amplifier. This offset voltage V1 is supplied to an analog input port AN1 of the microprocessor 110 as a monitor signal. Positive wirings 104a to 104d are connected to input terminals CH1 to CH4 of a multiplexer 130 through interface circuits 140a to 140d described in detail in FIG. 2.

The multiplexer 130 receives selecting commands SL1, SL2 from the microprocessor 110, and selects one of analog signals inputted to the input terminals CH1 to CH4, and inputs the selected analog signal to an analog input port AN2 of the microprocessor 110.

Figure 2:
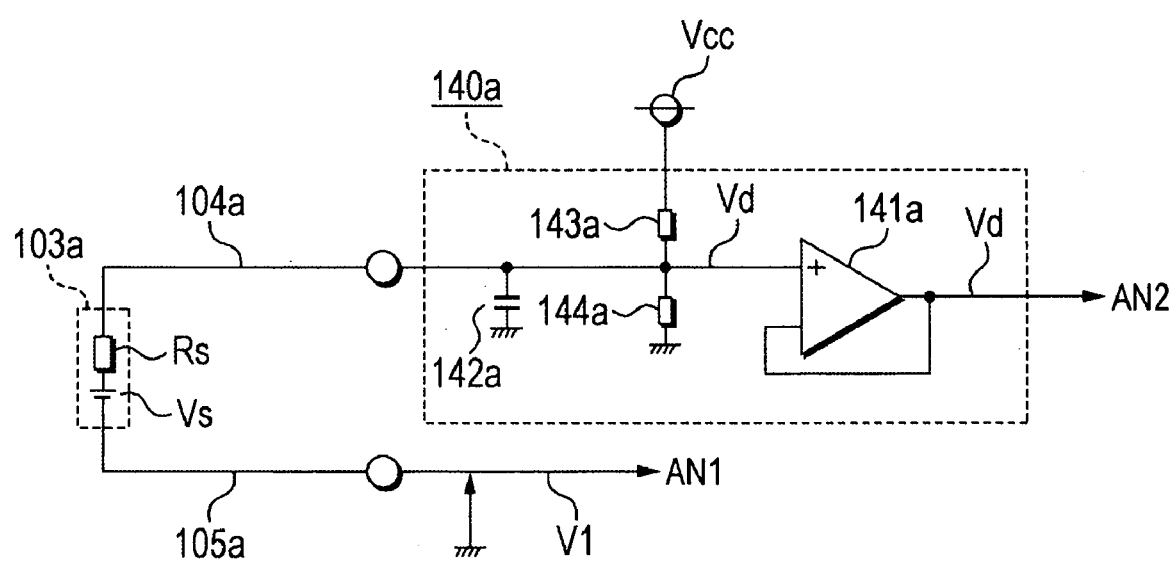
FIG. 2 is a detailed circuit diagram of an interface circuit section of FIG. 1.

In FIG. 2 as a detailed circuit diagram of an interface circuit section of FIG. 1, the interface circuit 140a connected to the positive wiring 104a of the exhaust gas sensor 103a is constructed by an arithmetic amplifier 141a, a smooth capacitor 142a connected between a non-inverting input terminal of the arithmetic amplifier 141a and a ground circuit, a pull-down resistor 144a, and a pull-up resistor 143a connected between the non-inverting input terminal of the arithmetic amplifier 141a and an output terminal of the constant voltage electric power source circuit 120. An output terminal and an inverting input terminal of the arithmetic amplifier 141a are directly connected to each other and impedance conversion is performed in a state of amplification factor 1. The interface circuits 140b to 140d are also similarly constructed, and the offset voltage V1 is applied to negative wirings 105a to 105d.

A measuring voltage Vd as an output voltage of the arithmetic amplifier 141a constructed in this way is shown by the following formula. In this formula, Vcc is the control electric power source voltage, and Rs is an equivalent internal resistance of the exhaust gas sensor 103a, and Vs is a generating voltage of the exhaust gas sensor 103a. V1 is the offset voltage, and R143 and R144 are resistance values of the pull-up resistor 143a and the pull-down resistor 144a. The relation of R143, R144>>Rs is set to be formed.

$$Vd \cong Vs + V1 + \Delta V1, \text{ Here, } \Delta V1 = Vcc \times (Rs/R143) \quad (1)$$

A bias voltage Vp as an input voltage of the arithmetic amplifier 141a at a disconnecting time of the positive and negative wirings and the sensor itself is shown by the following formula.

$$Vp = Vcc \times R144/(R143+R144) \quad (2)$$

When V1=0.5V, Vs=0 to 1.0V, Vcc=5.0V, Rs=20 KΩ, R143=1000 KΩ and R144=47 KΩ are set as one example, $\Delta V1 = Vcc(Rs/R143) = 0.1V$ and $Vp = Vcc \times R144/(R143+R144) = 0.22V$ are formed.

If a ground abnormality of the negative wirings 105a to 105d is generated, the monitor signal with respect to the offset voltage V1 inputted to the analog input port AN1 is reduced from a normal value 0.5V to 0V so that the microprocessor 110 can detect the negative line ground abnormality.

Similarly, when a sky short circuit abnormality of the negative wirings 105a to 105d is generated, the microprocessor 110 can detect the negative line sky short circuit abnormality by increasing the monitor signal with respect to the offset voltage V1 from 0.5V to 5V.

On the other hand, when a ground abnormality of the positive wiring 104a is generated, the value of the measuring voltage Vd inputted to the analog input port AN2 is reduced to 0V although this value is originally at least 0.5V or more. Thus, the microprocessor 110 can detect the positive line ground abnormality.

However, when the ground abnormality of the negative wiring is already detected, a ground abnormality judgment of the positive wiring is avoided.

Similarly, when a sky short circuit abnormality of the positive wiring 104a is generated, the value of the measuring voltage Vd is increased to 5V although this value is originally 1.5V or less. Thus, the microprocessor 110 can detect the positive line sky short circuit abnormality.

When a disconnecting case of the positive wiring 104a or the negative wiring 105a is now supposed, the electric potential of the non-inverting input terminal of the arithmetic amplifier 141a becomes a bias voltage Vp partially divided by the pull-up resistor 143a and the pull-down resistor 144a. When Vp=0.22V as a value less than 0.5V is selected as this voltage, the microprocessor 110 can detect a disconnection abnormality by discriminating this disconnection abnormality from the ground abnormality of the positive wiring.

However, if no pull-up resistor 143a is connected in the circuit of FIG. 2, a generating time of the disconnection abnormality and a generating time of the ground abnormality cannot be discriminated. Similarly, if no pull-down resistor 144a is connected in the circuit of FIG. 2, a generating time of the disconnection abnormality and a generating time of the sky short circuit abnormality cannot be discriminated.

In each case, the disconnection abnormality itself can be detected, and the detected abnormality might be the ground abnormality and might be the sky short circuit abnormality so that it becomes uncertain. Accordingly, it is desirable to be able to discriminate these abnormalities although this discrimination is no indispensable requisite.

As mentioned above, the disconnection abnormality can be discriminated as a connection result of both the pull-up resistor 143a and the pull-down resistor 144a. However, a small voltage $\Delta V1$ partially divided by the pull-up resistor 143a and the internal resistor Rs is added to the measuring voltage Vd in a normal state. Accordingly, as shown by formula (1), the microprocessor 110 can arithmetically calculate the generating voltage Vs by subtracting the offset voltage V1 and the small voltage $\Delta V1$ from the measuring voltage Vd.

The pull-up resistor 143a may be also connected to an offset voltage generating circuit 121 instead of connection to an output circuit of the constant voltage electric power source circuit 120.

In this case, Vcc in formulas (1) and (2) is replaced with V1.

Further, the amplification factor of the arithmetic amplifier 141a is set to 1, but a predetermined amplification factor can be also set in a range in which no measuring voltage Vd becomes the control electric power source voltage Vcc or more.

(2) Detailed Explanation of Action and Operation

The action and operation of the first embodiment device of this invention constructed as shown in FIGS. 1 and 2 will next be explained on the basis of the flow charts shown in FIGS. 3 to 5.

First, in the constructions shown in FIGS. 1 and 2, when the output contact 102 is closed, electricity is supplied from the constant voltage electric power source circuit 120 to the microprocessor 110 and the microprocessor 110 then starts an operation. Driving control with respect to the various kinds of electric loads 107 is executed in accordance with operating states and signal levels of the various kinds of input sensors 106 and the exhaust gas sensors 103a to 103d and the contents of an input-output control program stored to the program memory 111A. In its executing process, an abnormality inspecting operation shown in FIGS. 3 to 5 is performed.

In FIG. 3 as a flow chart for explaining the inspecting operation of FIG. 1, process 200 is a step for starting the inspecting operation by the microprocessor 110. This starting step is again repeatedly executed at the interval of a predetermined standby time subsequently to an operation terminating step shown in process 219 described later. Subsequent process 201 is a step for designating a channel number of the multiplexer 130 and setting which one among the exhaust gas sensors 103a to 103d a sensor desirous to be inspected is. Subsequent process block 210 is a step for executing a subroutine program as a second abnormality diagnosing means described in detail in FIG. 4. In this process block 210, the existence of ground, sky short circuit and disconnection abnormalities relative to positive terminal wiring of the exhaust gas sensor designated in process 201 is judged.

Subsequent process 209 is a step for updating and setting a channel number executed in the inspecting operation of the next time. Process 201 is set so as to read the channel number updated and set in process 209 and perform the inspecting operation of the next time.

Process block 220 constructed by a series of processes 212 to 217 subsequent to process 209 expresses the contents of a program as a first abnormality diagnosing means. In this process block 220, the existence of ground and sky short circuit abnormalities relative to negative terminal wiring of the exhaust gas sensors 103a to 103d is judged.

First, process 212 executed subsequently to process 209 is a step in which a digital converting value D1 of the value of the offset voltage V1 inputted to the analog input port AN1 of the microprocessor 110 and digitally converted by the multi-channel AD converter 114 is read to a first address of the RAM memory 112. Subsequent step 213 is a judging step for comparing the large and small relation of the digital converting value D1 read in process 212 and a second threshold value E2. If D1≦E2, the judgment of YES is made and it proceeds to process 215 in the judging step. In contrast to this, if D1>E2, the judgment of NO is made and it proceeds to process 216 in the judging step.

A value of a 90% level as a value reliably smaller than the digital converting value D1 (e.g., 100) of the normal offset voltage V1 (e.g., 0.5V) is used as the value of the second threshold value E2. In the normal state, no judgment of YES is made in process 213. Process 216 is a judging step for comparing the large and small relation of the digital converting value D1 read in process 212 and a third threshold value E3. If D1<E3, the judgment of NO is made and it proceeds to process block 230 in the judging step. In contrast to this, if E3≦D1, the judgment of YES is made and it proceeds to process 217 in the judging step.

A value of a 110% level as a value reliably greater than the digital converting value D1 (e.g., 100) of the normal offset voltage V1 (e.g., 0.5V) is used as the value of the third threshold value E3. In the normal state, no judgment of YES is made in process 216.

Accordingly, process 215 becomes a step for temporarily storing the ground abnormality when a perfect ground abnormality or an imperfect ground abnormality of the negative terminal wiring is generated. Process 217 is a step for temporarily storing the sky short circuit abnormality when a perfect sky short circuit abnormality or an imperfect sky short circuit abnormality of the negative terminal wiring is generated. However, a temporarily stored abnormality state is decided and stored after this state is reconfirmed as described later.

Process block 230 is a subroutine program as an abnormality processing means executed when the judgment of NO is made in process 216, or subsequently to process 215 and process 217. In this process block 230, as described in detail in FIG. 5, processing such as judgment confirmation of the abnormality state, abnormality annunciation, storage of abnormality hysteresis information, etc. is executed. Subsequently, it proceeds to process 219 as an inspection terminating step. As mentioned above, in this embodiment mode, a positive terminal abnormality and a negative terminal abnormality of one exhaust gas sensor are inspected by a flow of one cycle from process 200 to process 219. The abnormalities relative to the other exhaust gas sensors are sequentially inspected by repeatedly and circulatively executing the flow of one cycle. Process block 220 may be also executed before processes 201 to 209.

In FIG. 4 as a flow chart for explaining an operation relative to a second abnormality diagnosis in FIG. 3, process 310 is an operation starting step of the second abnormality diagnosis. This process 310 is constructed so as to be executed subsequently to process 201 of FIG. 3, and be returned to process 209 subsequently to process 319 described later. Process block 320 constructed by a series of processes 311 to 318d subsequent to process 310 expresses the contents of process block 210 in FIG. 3.

First, process 311 executed subsequently to process 310 is a step in which a digital converting value D2 of the value of the measuring voltage Vd inputted to the analog input port AN2 of the microprocessor 110 and digitally converted by the multi-channel AD converter 114 is read to a second address of the RAM memory 112. Subsequent step 312 is a judging step for comparing the large and small relation of the digital converting value D2 read in process 311 and the second threshold value E2. If D2≦E2, the judgment of YES is made and it proceeds to process 313 in the judging step. In contrast to this, if D2>E2, the judgment of NO is made and it proceeds to process 317 in the judging step.

Process 313 is a judging step for comparing the large and small relation of the digital converting value D2 read in process 311 and a first threshold value E1. If D2>E1, the judgment of NO is made and it proceeds to process 314 in the judging step. In contrast to this, if D2≦E1, the judgment of YES is made and it proceeds to process 316a in the judging step.

A value of a 90% level as a value reliably smaller than the digital converting value D2 (e.g., 100) of the normal offset voltage V1 (e.g., 0.5V) as mentioned above is used as the value of the second threshold value E2. In process 312, no judgment of YES is made if it is the normal state. Further, a value of a 90% level of the value of digital converting value D2 (e.g., 44) with respect to a bias voltage Vp (e.g., 0.22V) is used as the first threshold value E1.

Process 314 is a judging process in which the operation of a warming-up machine is completed according to whether e.g., several minutes have passed after an operation start, and it is judged whether it is presumed that the exhaust gas sensors 103a to 103d attain an activating state. When it is presumed as activation completion, the judgment of YES is made and it proceeds to process 315. In contrast to this, when it is presumed that no activation is completed, the judgment of NO is made and it proceeds to process 319.

Process 315 is a step in which the judgment of process 312 is the second threshold value (corresponding to 90% of 0.5V) or less and the judgment of process 313 is the first threshold value (corresponding to 90% of 0.22V) or more so that it is judged that the positive terminal wiring or the sensor itself is disconnected and this state is temporarily stored to the RAM memory 112. Process block 330a constructed by processes 313 to 315 becomes a third abnormality diagnosing means.

In process 316a, it is read whether no negative terminal ground abnormality is temporarily stored by process 215 of FIG. 3. If it is a negative terminal ground state, the judgment of YES is made and it proceeds to process 319. In contrast to this, if it is no negative terminal ground state, the judgment of NO is made and it proceeds to process 316b. Process 316b is a step in which it is judged that the judgment of process 313 is the first threshold value (corresponding to 90% of 0.22V) or less and the judgment of process 316a is no negative terminal ground state so that it is judged as ground of the positive terminal wiring and this state is temporarily stored to the RAM memory 112.

Process 317 is a judging step for comparing the large and small relation of the digital converting value D2 read in process 311 and a fourth threshold value E4. If D2<E4, the judgment of NO is made and it proceeds to process 319 in the judging step. In contrast to this, if E4≦D2, the judgment of YES is made and it proceeds to process 318a in the judging step.

A value of a 110% level as a value reliably greater than the digital converting value D2 (e.g., 300) of 1.5V provided by adding the normal offset voltage V1 (e.g., 0.5V) and a maximum value Vm (e.g., 1V) of the generating voltage Vs of the exhaust gas sensor is used as the value of the fourth threshold value E4. If it is the normal state, no judgment of YES is made in process 317.

In process 318a, it is read whether no negative terminal sky short circuit abnormality is temporarily stored by process 217 of FIG. 3. If it is a negative terminal sky short circuit state, the judgment of YES is made and it proceeds to process 318c. In contrast to this, if it is no negative terminal sky short circuit state, the judgment of NO is made and it proceeds to process 318b.

Process 318b is a step in which it is judged that the judgment of process 317 is the fourth threshold value (corresponding to 110% of 1.5V) or more and the judgment of process 318a is no negative terminal sky short circuit state so that it is judged as a sky short circuit of the positive terminal wiring and this state is temporarily stored to the RAM memory 112.

Process 318c is a judging step for judging whether a differential value of the digital converting value D2 of a positive terminal electric potential and the digital converting value D1 of a negative terminal electric potential is excessively large in comparison with the digital converting value corresponding to the maximum value Vm of the generating voltage Vs of the above exhaust gas sensor. If the differential value is excessively large, the judgment of YES is made and it proceeds to process 318b in the judging step. In contrast to this, if no differential value is excessively large, the judgment of NO is made and it proceeds to process 318d in the judging step.

Process 318d is a judging step for comparing the large and small relation of the digital converting value D2 read in process 311 and a fifth threshold value E5. If D2<E5, the judgment of NO is made and it proceeds to process 319 in the judging step. In contrast to this, E5≦D2, the judgment of YES is made and it proceeds to process 318b in the judging step.

The value of the fifth threshold value E5 is a digital converting value with respect to the value of a 90% level of the control electric power source voltage Vcc. If it is the normal state, no judgment of YES is made in process 318d. Process 315 is a step for temporarily storing a disconnection abnormality. Process 316b is a step for temporarily storing a positive terminal ground abnormality. Process 318b is a step for temporarily storing a positive terminal sky short circuit abnormality. However, a temporarily stored abnormality state is reconfirmed as described later, and is then decided and stored. It proceeds to process 319 when the judgments of processes 314, 317 and 318d are NO and the judgment of process 316a is YES, or subsequently to processes 315, 316b and 318b. It then proceeds to process 209 of FIG. 3 from process 319.

Process block 330b constructed by processes 316a, 318a, 318c, 318d becomes a positive terminal abnormality judgment avoiding means. For example, when a negative terminal ground abnormality is generated in process 316a and the generating voltage Vs of the exhaust gas sensor becomes a level of 0V, the positive terminal electric potential becomes a zero level although it is no positive terminal sky short circuit. Therefore, if it is normal, it is judged as a positive terminal ground abnormality. Accordingly, process block 330b becomes a means for avoiding such an erroneous judgment.

The microprocessor 110 subtracts the digital converting value D1 of the negative terminal electric potential from the digital converting value D2 of the positive terminal electric potential, and obtains the digital converting value of the generating voltage Vs of the exhaust gas sensor. Accordingly, even when the negative terminal attains a perfect ground state or an imperfect ground abnormality, and the ground abnormality is detected, the generating voltage Vs can be detected and no state for damaging control performance is attained.

Similarly, even when the negative terminal attains an imperfect sky short circuit abnormality and the sky short circuit abnormality is detected, the generating voltage Vs can be detected if no positive terminal electric potential is excessively large. Therefore, no state for damaging the control performance is attained. Accordingly, if the abnormality is annunciated and inspection and repair are rapidly performed and the negative terminal abnormality is dissolved, the real harm in control performance is avoided and an obstacle is foreknown.

In FIG. 5 as a flow chart for explaining an operation relative to the abnormality processing means in FIG. 3, process 340 is an operation starting step of the abnormality processing means. This process 340 is constructed so as to be executed subsequently to process block 220 of FIG. 3, and be returned to process 219 subsequently to process 349 described later. Process block 350 constructed by a series of processes 341 to 348 subsequent to process 340 expresses the contents of process block 230 in FIG. 3.

Process 341 executed subsequently to process 340 is a judging step for retrieving whether some abnormality judgment is stored in process blocks 210 and 220 of FIG. 3. If no abnormality judgment is stored, the judgment of NO is made and it proceeds to process 349 in the judging step. In contrast to this, if the abnormality judgment is stored, the judgment of YES is made and it proceeds to process 342 in the judging step. Process 342 is a step for again executing process blocks 220 and 210 of FIG. 3, and confirming whether no abnormality judgment is a temporary erroneous operation judgment. Subsequent process 343 is a judging step in which the judgment of YES is made and it proceeds to process 344 when the abnormality judgment is again confirmed by process 342, and the judgment of NO is made and it proceeds to process 346 when no abnormality is reproduced.

Process 344 is a step for deciding and storing an abnormality part and an abnormality mode confirmed and judged in process 342 to the RAM memory 112. Subsequent process 345 is a step for generating a driving command with respect to an unillustrated alarm indicator and annunciating the abnormality. Subsequent step 346 is a judging step for judging whether it is a period for storing abnormality hysteresis information. For example, after an unillustrated electric power source switch is opened, the judgment of YES is made in a predetermined period for continuously closing the output contact 102 of the electric power source relay, and it then proceeds from this process 346 to process 347. When the electric power source switch is closed, the judgment of NO is made and it proceeds to process 349.

Process 347 is a step for reading past hysteresis information already written to the nonvolatile data memory 113, and obtaining abnormality generating time number information every abnormality part and abnormality mode. Subsequent process 348 is a step for adding the abnormality generating time number by one time with respect to the abnormality part and the abnormality mode decided and stored in process 344, and again transferring and storing the added abnormality generating time number to the data memory 113. It then proceeds to process 349 when the judgments of processes 341 and 346 are NO, or subsequently to process 348. Further, it proceeds and is returned to process 219 of FIG. 3 from process 349.

(3) Main point and feature of embodiment mode 1.

The engine controller 100A in embodiment mode 1 of this invention is an engine controller having the microprocessor 110 for operating and controlling various kinds of electric loads 107 for operating the above internal combustion engine in accordance with the operating states of various kinds of input sensors 106 for monitoring an operating state of the internal combustion engine, and the contents of a control program stored to the program memory 111A.

The above various kinds of input sensors 106 include plural exhaust gas sensors 103a to 103d. These exhaust gas sensors 103a to 103d have an equivalent voltage source and an equivalent internal resistor connected between a pair of positive and negative terminals. A theoretical air fuel ratio is set to a boundary at a predetermined activation temperature, and the generating voltage Vs of the above equivalent voltage source is changed from a minimum value V0 to a maximum value Vm.

A predetermined offset voltage V1 generated by the offset voltage generating circuit 121 is applied to the respective negative terminals of the above plural exhaust gas sensors 103a to 103d. The negative terminal electric potential as a voltage between this negative terminal and the ground circuit GND is digitally converted through the multi-channel AD converter 114, and is stored to the RAM memory 112 for arithmetic processing through the above microprocessor 110.

At least one of the pull-down resistor 144a (to 144d) and the pull-up resistor 143a (to 143d) of high resistance connected to the ground circuit GND, and the bias resistor 153a (to 153d) of high resistance for giving a predetermined bias electric potential is connected to each of the positive terminals of the above plural exhaust gas sensors 103a to 103d. The positive terminal electric potential as the voltage between this positive terminal and the ground circuit GND is respectively individually and digitally converted through the multi-channel AD converter 114, and is stored to the above RAM memory 112 for arithmetic processing through the above microprocessor 110.

The above program memory 111A includes at least a program as the first and second abnormality diagnosing means 220, 210 and a program as the positive terminal abnormality judgment avoiding means 330b. In the above first abnormality diagnosing means 220, it is judged that it is a sky short circuit abnormality for making the negative terminal wiring come in mixing contact with an electric power source line, or a ground abnormality for making the negative terminal wiring come in mixing contact with a ground line according to whether the digital converting value D1 of the above negative terminal electric potential is excessively large or small with a value proportional to the above offset voltage V1 as a reference.

In the above second abnormality diagnosing means 210, it is judged that it is a sky short circuit abnormality for making the positive terminal wiring come in mixing contact with the electric power source line, or a ground abnormality for making the positive terminal wiring come in mixing contact with the ground line according to whether the digital converting value D2 of the above positive terminal electric potential is excessively large with a value proportional to an adding value V1+Vm of the above offset voltage V1 and a maximum detecting voltage Vm as a reference, or is excessively small with the value proportional to the above offset voltage V1 as a reference. When a disconnection abnormality is generated, the second abnormality diagnosing means 210 judges this disconnection abnormality as the above ground abnormality or sky short circuit abnormality. The above microprocessor 110 obtains a digital converting value proportional to the generating voltage Vs of the above exhaust gas sensors 103a to 103d by a differential arithmetic calculation of the digital converting value D2 of the above positive terminal electric potential and the digital converting value D1 of the negative terminal electric potential. The microprocessor 110 also annunciates the abnormality according to a diagnosing result using the above first and second abnormality diagnosing means 220, 210.

When the above first abnormality diagnosing means 220 detects at least the ground abnormality of the negative terminal wiring, the above positive terminal abnormality judgment avoiding means 330b makes no ground abnormality judgment of the positive terminal wiring using the above second abnormality diagnosing means 210. Thus, the positive terminal abnormality judgment avoiding means 330b becomes a means for considering the differential arithmetic calculation of the above microprocessor to be valid.

A bias adding resistor is connected to each of the positive terminals of the above plural exhaust gas sensors 103a to 103d. The above program memory 111A includes a program as a third abnormality diagnosing means 330a. The above bias adding resistor is constructed so as to apply a predetermined bias voltage Vp by combining a pair of pull-up resistor 143a (to 143d) and pull-down resistor 144a (to 144d) connected to an input circuit of the arithmetic amplifier 141a (to 141d) connected to each of the positive terminal wirings 104a to 104d of the above exhaust gas sensors 103a to 103d.

The above bias voltage Vp is set so as to become a value smaller than the above offset voltage V1, or a value greater than the adding value V1+Vm of the above offset voltage V1 and the maximum detecting voltage Vm.

The above third abnormality diagnosing means 330a is a means for judging that it is a disconnection abnormality of a sensor circuit when the digital converting value D2 of the above positive terminal electric potential corresponds to the digital converting value of the bias voltage Vp added by the above pull-down resistor 144a (to 144d) and the pull-up resistor 143a (to 143d). The above third abnormality diagnosing means 330a becomes effective after a predetermined time has passed after an operation start, and a time presumed as activation of the above exhaust gas sensors 103a to 103d has passed. Accordingly, since the sky short circuit and ground abnormalities and the disconnection abnormality can be detected so as to be discriminated, there is a feature for improving efficiency of maintenance inspection.

The electric potential of each of the positive terminals of the above plural exhaust gas sensors 103a to 103d is selectively supplied to one analog input terminal of the above multi-channel AD converter 114 through the multiplexer 130. An output voltage of the above offset voltage generating circuit 121 commonly connected to each of the negative terminals of the above plural exhaust gas sensors 103a to 103d is supplied to another input terminal of the above multi-channel AD converter 114. The above multiplexer 130 makes selecting connection of an analog input signal by selective commands SL1, SL2 from the above microprocessor 110.

Accordingly, the negative terminal side electric potential can be monitored without increasing the number of analog input points of the multi-channel AD converter. Further, when a specific exhaust gas sensor among the plural exhaust gas sensors is noticed, it is characterized in that its generating voltage can be rapidly calculated differentially and arithmetically.

The above program memory 111A further includes a program as a judgment confirming means 342 and an abnormality processing means 350. The above judgment confirming means 342 is operated when the above first, second and third abnormality diagnosing means 220, 320, 330a detect the existence of an abnormality. The judgment confirming means 342 then reconfirms an abnormality state of the exhaust gas sensors 104a to 104d judged as the abnormality. When no abnormality generation is confirmed, the judgment confirming means 342 neglects the judging result as a temporary erroneous judgment.

The above abnormality processing means 350 is executed and warns and indicates an abnormality generating state when the above judgment confirming means 342 reconfirms the abnormality state. Further, the abnormality processing means 350 stores and preserves this abnormality generating state to a nonvolatile data memory as abnormality generating hysteresis information.

Accordingly, it is characterized in that the positive terminal electric potential and the negative terminal electric potential of the exhaust gas sensor generating the abnormality are rapidly reconfirmed and the abnormality is annunciated, and only the generated and confirmed abnormality information can be accumulated and stored to the nonvolatile data memory.

Embodiment Mode 2 of the Invention (1) Detailed Explanation of Construction

Figure 6:
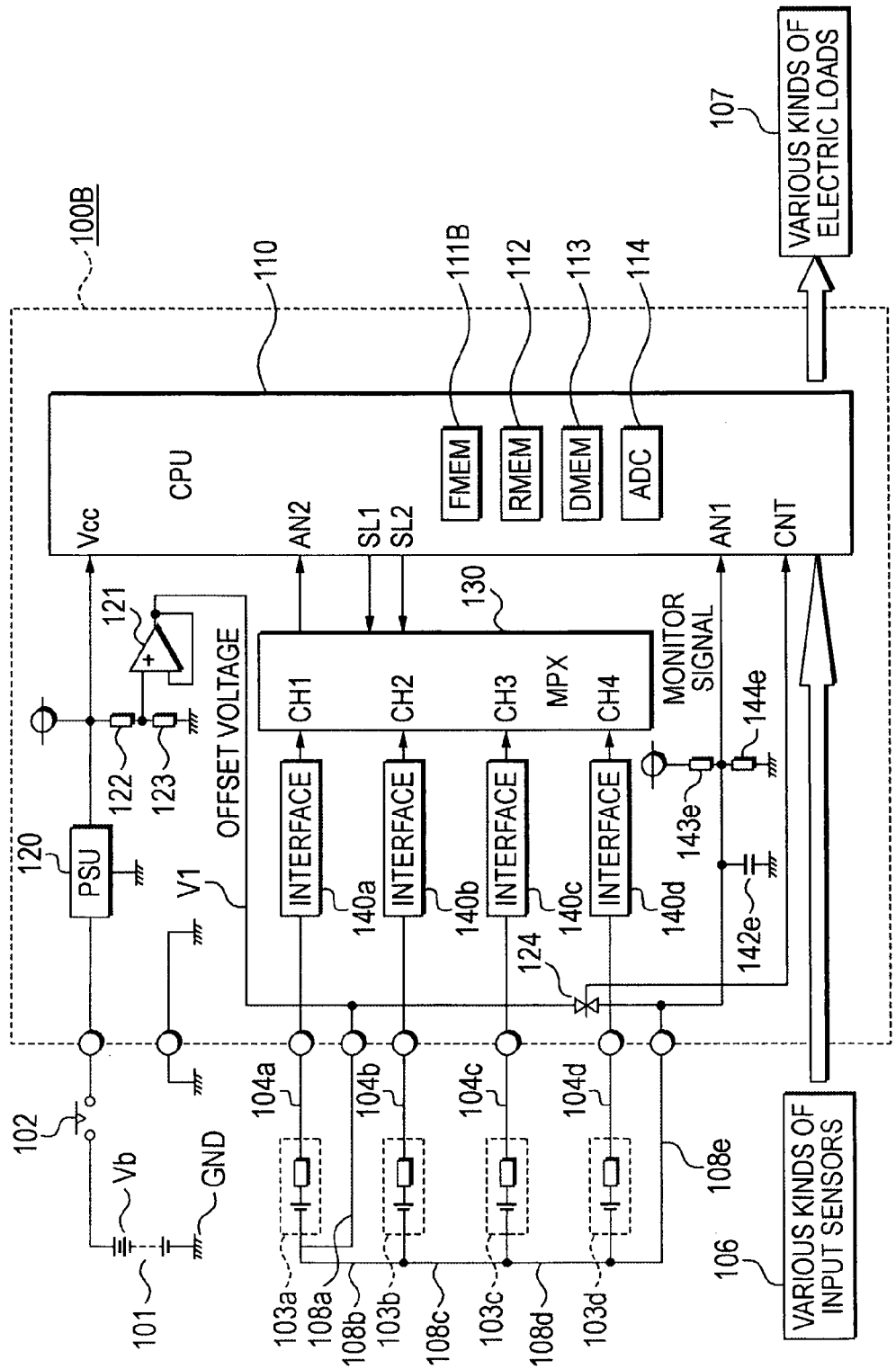
FIG. 6 is a circuit block diagram of a second embodiment device of this invention.

FIG. 6 showing a circuit block diagram of a second embodiment device of this invention will next be explained with points different from those of FIG. 1 as a center. FIG. 6 differs from FIG. 1 in a method of negative line wiring of exhaust gas sensors 103a to 103d, and addition of a negative line disconnection abnormality detecting means is a main different point. The same or corresponding portions are designated by the same reference numerals as FIG. 1.

In FIG. 6, similar to FIG. 1, a vehicle mounting battery 101, an output contact 102 of an electric power source relay, various kinds of input sensors 106 and various kinds of electric loads 107 are connected to an engine controller 100B. Further, positive terminals of plural exhaust gas sensors 103a to 103d are connected to the engine controller 100B by positive wirings 104a to 104d.

A negative terminal of the exhaust gas sensor 103a is connected to the engine controller 100B by first negative wiring 108a. The negative terminals of the respective exhaust gas sensors 103a to 103d are sequentially connected by transition wirings 108b to 108d. The negative terminal of the exhaust gas sensor 103d is connected to the engine controller 100B by second negative wiring 108e.

As the internal construction of the engine controller 100B, similar to FIG. 1, the microprocessor 110 is mutually bus-connected so as to be cooperated with a program memory 111B as e.g., a nonvolatile flash memory, a RAM memory 112 for arithmetic processing, a data memory 113 as e.g., a nonvolatile EEPROM memory, and a multi-channel AD converter 114.

Figure 7:
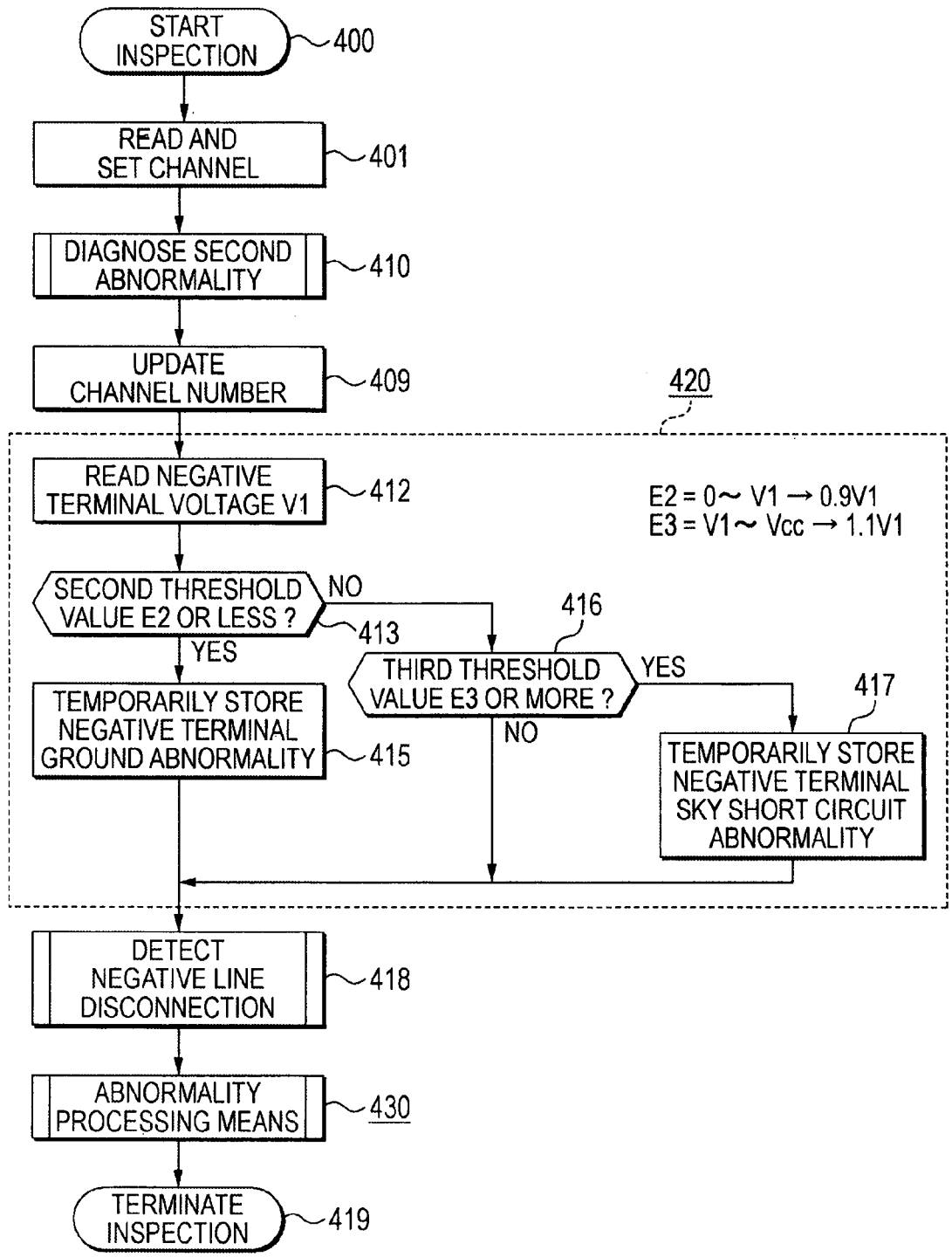
FIG. 7 is a flow chart for explaining an inspecting operation of FIG. 6.
Figure 8:
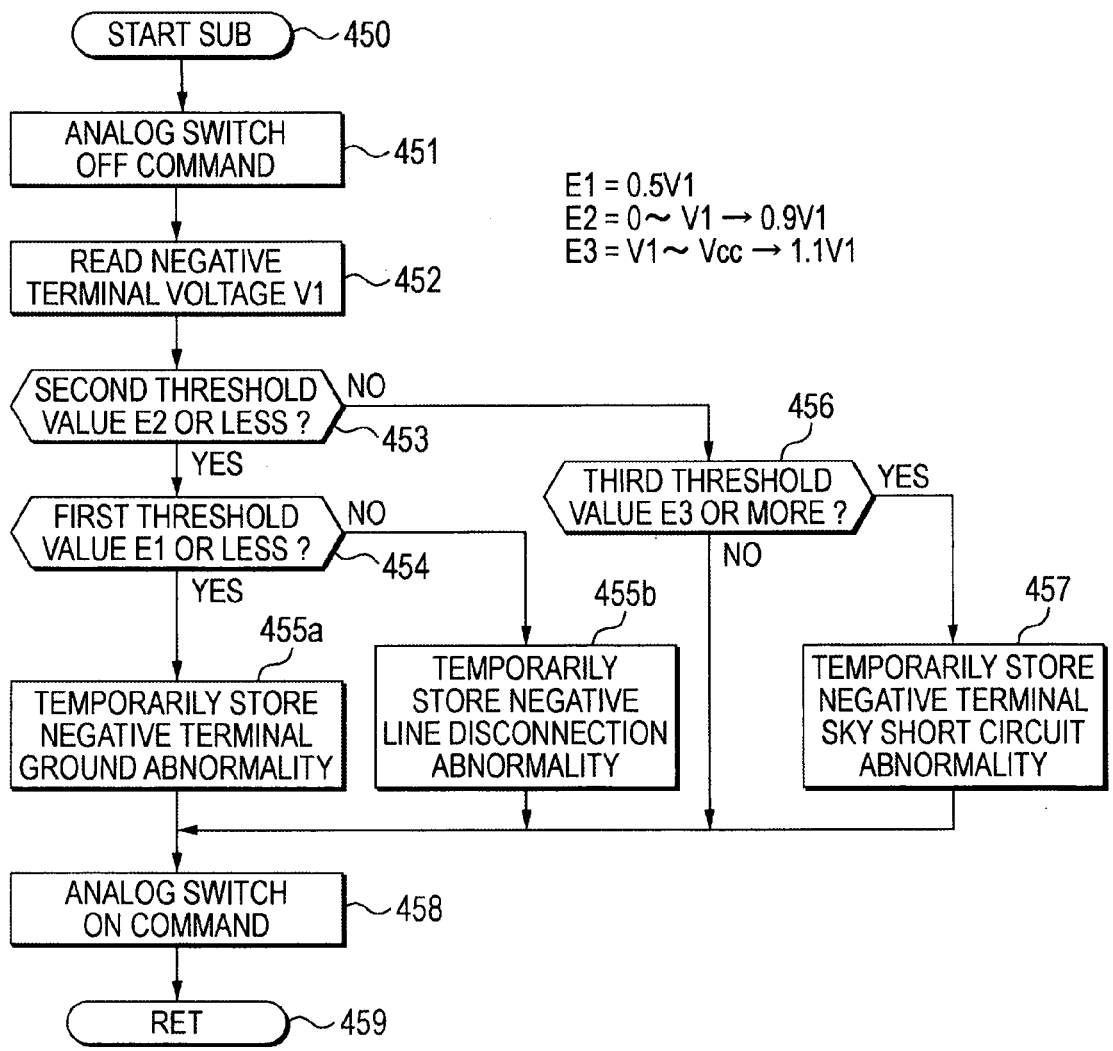
FIG. 8 is a flow chart for explaining an operation relative to detection of negative line disconnection in FIG. 7.

A program as various kinds of abnormality diagnosing means and abnormality processing means described later in FIGS. 7 and 8 is stored to the program memory 111B in addition to an input-output control program as the engine controller 100B. A constant voltage electric power source circuit 120, voltage dividing resistors 122, 123 and an offset voltage generating circuit 121 are constructed similarly to those of FIG. 1. However, an offset voltage V1 as an output voltage of the offset voltage generating circuit is applied to the negative terminals of the exhaust gas sensors 103a to 103d by a first negative line 108a and transition wirings 108b to 108d. This offset voltage V1 is also supplied to an analog input port AN1 of the microprocessor 110 as a monitor signal through a second negative line 108e. Further, first and second negative wirings 108a and 108e are always short-circuited and connected by an opening-closing element 124 for inspection within the engine controller 100B.

Accordingly, when the negative line wiring is disconnected in somewhere and there is a contact defect of a connector, the offset voltage V1 is supplied from the first negative wiring 108a side or the second negative wiring 108e side, and a state able to continue a normal operation is attained.

However, when such a negative line disconnection abnormality is generated, the opening-closing element 124 for inspection is tried so as to be temporarily opened by an inspecting command CNT of the microprocessor 110. Thus, an abnormality judgment can be made by an outline described later.

On the other hand, positive wirings 104a to 104d are connected to input terminals CH1 to CH4 of a multiplexer 130 through interface circuits 140a to 140d described in detail in FIG. 2.

The multiplexer 130 receives selecting commands SL1, SL2 from the microprocessor 110, and selects one of analog signals inputted to the input terminals CH1 to CH4, and inputs the selected analog signal to an analog input port AN2 of the microprocessor 110.

A capacitor 142e for smoothing is connected to the analog input port AN1 for monitoring the value of the offset voltage V1. A partially divided voltage constructed by a second pull-up resistor 143e as high resistance and a second pull-down resistor 144e is applied to the analog input port AN1 as a second bias voltage. This second bias voltage may be set to a voltage level clearly different from that of the offset voltage V1.

(3) Detailed Explanation of Action and Operation

The action and operation of the second embodiment device of this invention constructed as shown in FIG. 6 will next be explained on the basis of the flow charts shown in FIGS. 7 and 8.

First, in the construction shown in FIG. 6, when the output contact 102 is closed, electricity is supplied from the constant voltage electric power source circuit 120 to the microprocessor 110 and the microprocessor 110 begins to be operated. Driving control with respect to various kinds of electric loads 107 is executed in accordance with operating states and signal levels of various kinds of input sensors 106 and exhaust gas sensors 103a to 103d and the contents of an input-output control program stored to the program memory 111B. In its executing process, an abnormality inspecting operation shown in FIGS. 7 and 8 is performed.

In FIG. 7 as a flow chart for explaining the inspecting operation of FIG. 6, process 400 is a step for starting the inspecting operation by the microprocessor 110. This starting step is again repeatedly executed at the interval of a predetermined standby time subsequently to an operation terminating step shown in process 419 described later.

Subsequent process 401 is a step for designating a channel number of the multiplexer 130, and setting which one among the exhaust gas sensors 103a to 103d a sensor desirous to be inspected is. Subsequent process block 410 is a step for executing a subroutine program as the above second abnormality diagnosing means described in FIG. 4. In this process block 410, the existence of ground, sky short circuit and disconnection abnormalities relative to the positive terminal wiring of the exhaust gas sensor designated in process 401 is judged.

Subsequent process 409 is a step for updating and setting the channel number executed in the inspecting operation of the next time. In process 401, the channel number updated and set in process 409 is read and the inspecting operation of the next time is performed.

Process block 420 constructed by a series of processes 412 to 417 subsequent to process 409 expresses the contents of a program as a first abnormality diagnosing means. In this process block 420, the existence of ground and sky short circuit abnormalities relative to the negative terminal wirings of the exhaust gas sensors 103a to 103d is judged.

First, process 412 executed subsequently to process 419 is a step in which a digital converting value D1 of the value of the offset voltage V1 inputted to the analog input port AN1 of the microprocessor 110 and digitally converted by the multi-channel AD converter 114 is read to a first address of the RAM memory 112. Subsequent process 413 is a judging step for comparing the large and small relation of the digital converting value D1 read in process 412 and a second threshold value E2. If $D1 \leq E2$, the judgment of YES is made and it proceeds to process 415 in the judging step. In contrast to this, if $D1 > E2$, the judgment of NO is made and it proceeds to process 416 in the judging step.

A value of a 90% level as a value reliably smaller than the digital converting value D1 (e.g., 100) of the normal offset voltage V1 (e.g., 0.5V) is used as the value of the second threshold value E2. If it is a normal state, no judgment of YES is made in process 413.

Process 416 becomes a judging step for comparing the large and small relation of the digital converting value D1 read in process 412 and a third threshold value E3. If $D1 < E3$, the judgment of NO is made and it proceeds to process block 418 in the judging step. In contrast to this, if $E3 \leq D1$, the judgment of YES is made and it proceeds to process 417 in the judging step.

A value of a 110% level as a value reliably greater than the digital converting value D1 (e.g., 100) of the normal offset voltage V1 (e.g., 0.5V) is used as the value of the third threshold value E3. If it is the normal state, no judgment of YES is made in process 416.

Further, process 415 is a step for temporarily storing a negative terminal ground abnormality. Process 4-17 is a step for temporarily storing a negative terminal sky short circuit abnormality. However, a temporarily stored abnormality state is reconfirmed and is then decided and stored as described later.

Process block 418 is a subroutine program as a negative line disconnection detecting means executed when the judgment of NO is made in process 416, or subsequently to processes 415, 417. This process block 418 will be described in detail in FIG. 8.

Subsequent process block 430 is a subroutine program as an abnormality processing means. As described in detail in FIG. 5, processing such as judgment confirmation of the abnormality state, abnormality annunciation, storage of abnormality hysteresis information, etc. is executed. Subsequently, it proceeds to process 419 as an inspection terminating step.

Accordingly, in this embodiment mode, a positive terminal abnormality and a negative terminal abnormality of one exhaust gas sensor are also inspected by a flow of one cycle from process 400 to process 419. The abnormality inspections relative to the other exhaust gas sensors are sequentially made by repeatedly circulatively executing the flow of one cycle.

Process block 420 may be also executed before processes 401 to 409.

In FIG. 8 as a flow chart for explaining an operation relative to negative line disconnection detection in FIG. 7, process 450 is an operation starting step of the negative line disconnection detection. This process 450 is constructed so as to be executed subsequently to process block 420 of FIG. 7, and be returned to process block 430 subsequently to process 459 described later. The process block constructed by a series of processes 451 to 458 subsequent to process 450 expresses the contents of process block 418 in FIG. 7.

First, in process 451 executed subsequently to process 450, the microprocessor 110 opens an opening-closing element 124 for inspection by an inspecting command output CNT.

Subsequent process 452 is a step in which a digital converting value D1 of the value of an offset voltage V1 inputted to the analog input port AN1 of the microprocessor 110 and digitally converted by the multi-channel AD converter 114 is read to a first address of the RAM memory 112.

Subsequent step 453 is a judging step for comparing the large and small relation of the digital converting value D1 read in process 452 and the second threshold value E2. If $D1 \leq E2$, the judgment of YES is made and it proceeds to process 454 in the judging step. In contrast to this, if $D1 > E2$, the judgment of NO is made and it proceeds to process 456 in the judging step.

Process 454 is a judging step for comparing the large and small relation of the digital converting value D1 read in process 452 and the first threshold value E1. If $D1 > E1$, the judgment of NO is made and it proceeds to process 455b in the judging step. In contrast to this, if $D1 \leq E1$, the judgment of YES is made and it proceeds to process 455a in the judging step.

A value of a 90% level as a value reliably smaller than the digital converting value D1 (e.g., 100) of the normal offset voltage V1 (e.g., 0.5V) is used as the value of the second threshold value E2 as mentioned above. If it is a normal state, no judgment of YES is made in process 453.

Further, a value of a 90% level of the value of the digital converting value D1 (e.g., 44) with respect to a second bias voltage Vp (e.g., 0.22V) is used as the first threshold value E1.

Process 455a becomes a step in which the judgment of process 454 is the first threshold value (corresponding to 90% of 0.22V) or less so that it is judged as ground of negative terminal wiring, and this state is temporarily stored to the RAM memory 112.

Process 455b becomes a step in which the judgment of process 454 is the first threshold value (corresponding to 90% of 0.22V) or more so that it is judged as disconnection of the negative terminal wiring, and this state is temporarily stored to the RAM memory 112.

Process 456 is a judging step for comparing the large and small relation of the digital converting value D1 read in process 452 and the third threshold value E3. If D1<E3, the judgment of NO is made and it proceeds to process 458 in the judging step. In contrast to this, if E3≦D1, the judgment of YES is made and it proceeds to process 457 in the judging step.

A value of a 110% level as a value reliably greater than the digital converting value D1 (e.g., 100) of the normal offset voltage V1 (e.g., 0.5V) is used as the value of the third threshold value E3. If it is the normal state, no judgment of YES is made in process 456.

Process 457 becomes a step in which the judgment of process 456 is the third threshold value (corresponding to 110% of 0.5V) or more so that it is judged as a sky short circuit of the negative terminal wiring, and this state is temporarily stored to the RAM memory 112.

Process 455a is a step for temporarily storing a negative line ground abnormality. Process 455b is a step for temporarily storing a negative line disconnection abnormality. Process 457 is a step for temporarily storing a negative line sky short circuit abnormality. However, a temporarily stored abnormal state is reconfirmed and is then decided and stored in the above process block 430.

It proceeds to process 458 when the judgment of process 456 is NO, or subsequently to processes 455a, 455b, 457. In process 458, the microprocessor 110 closes the opening-closing element 124 for inspection by releasing an inspecting command CNT. It then proceeds to process block 430 of FIG. 7 from subsequent process 459.

(3) Main Point and Feature of Embodiment Mode 2

The engine controller 100B in accordance with embodiment mode 2 of this invention is an engine controller having the microprocessor 110 for operating and controlling various kinds of electric loads 107 for operating the above internal combustion engine in accordance with operating states of various kinds of input sensors 106 for monitoring an operating state of the internal combustion engine, and the contents of a control program stored to the program memory 111B.

The above various kinds of input sensors 106 include plural exhaust gas sensors 103a to 103d. A predetermined offset voltage V1 generated by the offset voltage generating circuit 121 is applied to each of the negative terminals of the above plural exhaust gas sensors 103a to 103d. A negative terminal electric potential as the voltage between this negative terminal and a ground circuit GND is digitally converted through the multi-channel AD converter 114, and is stored to the RAM memory 112 for arithmetic processing through the above microprocessor 110.

The above program memory 111B includes at least a program as the first and second abnormality diagnosing means 420, 410, and a program as the positive terminal abnormality judgment avoiding means 330b.

The positive terminals of the above plural exhaust gas sensors 103a to 103d are individually connected to the above engine controller 100B by individual positive wirings 104a to 104d.

The negative terminal of the first exhaust gas sensor 103a among the above plural exhaust gas sensors is connected to the above engine controller 100B by first negative wiring 108a. The negative terminals of the other exhaust gas sensors 103b to 103d are mutually sequentially connected by transition wirings 108b to 108d. The negative terminal of the final exhaust gas sensor 103d is connected to the above engine controller 100B by second negative wiring 108e.

The above first and second negative wirings 108a, 108e are connected within the above engine controller 100B, and constitute a loop circuit, and are connected to the common offset voltage generating circuit 121. The predetermined offset voltage V1 is thus applied to the first and second negative wirings 108a, 108e.

Accordingly, there are features in which the normal operation can be maintained even when one portion of the negative line is disconnected, and connector wiring can be reduced.

The above first and second negative wirings 108a, 108e are connected through the opening-closing element 124 for inspection within the above engine controller 100B. An output voltage of the above offset voltage generating circuit 121 is supplied as a monitor signal voltage to an analog input terminal of the above multi-channel AD converter 114 through the above opening-closing element 124 for inspection.

At least one or both a second pull-down resistor 144e connected to the ground circuit, and a second pull-up resistor 143e connected to an output terminal of the constant voltage electric power source circuit 120 are connected to an input circuit with respect to this analog input terminal. The above program memory 111B further includes a control program as a negative line disconnection abnormality detecting means 419.

When the above opening-closing element 124 for inspection is temporarily opened, the above negative line disconnection abnormality detecting means 419 compares the value of the above monitor signal voltage and the above offset voltage V1. The negative line disconnection abnormality detecting means 419 then detects the existence of a ground abnormality, a sky short circuit abnormality and a disconnection abnormality of wiring from the above offset voltage generating circuit 121 to the above multi-channel AD converter 114 via the first negative wiring 108a, the transition wirings 108b to 108d and the second negative wiring 108e. Accordingly, there are features in which the negative line disconnection is detected, and maintenance inspection can be promoted while no obstacle is generated as the actual mode.

Embodiment Mode 3 of the Invention (1) Detailed Explanation of Construction

Figure 9:
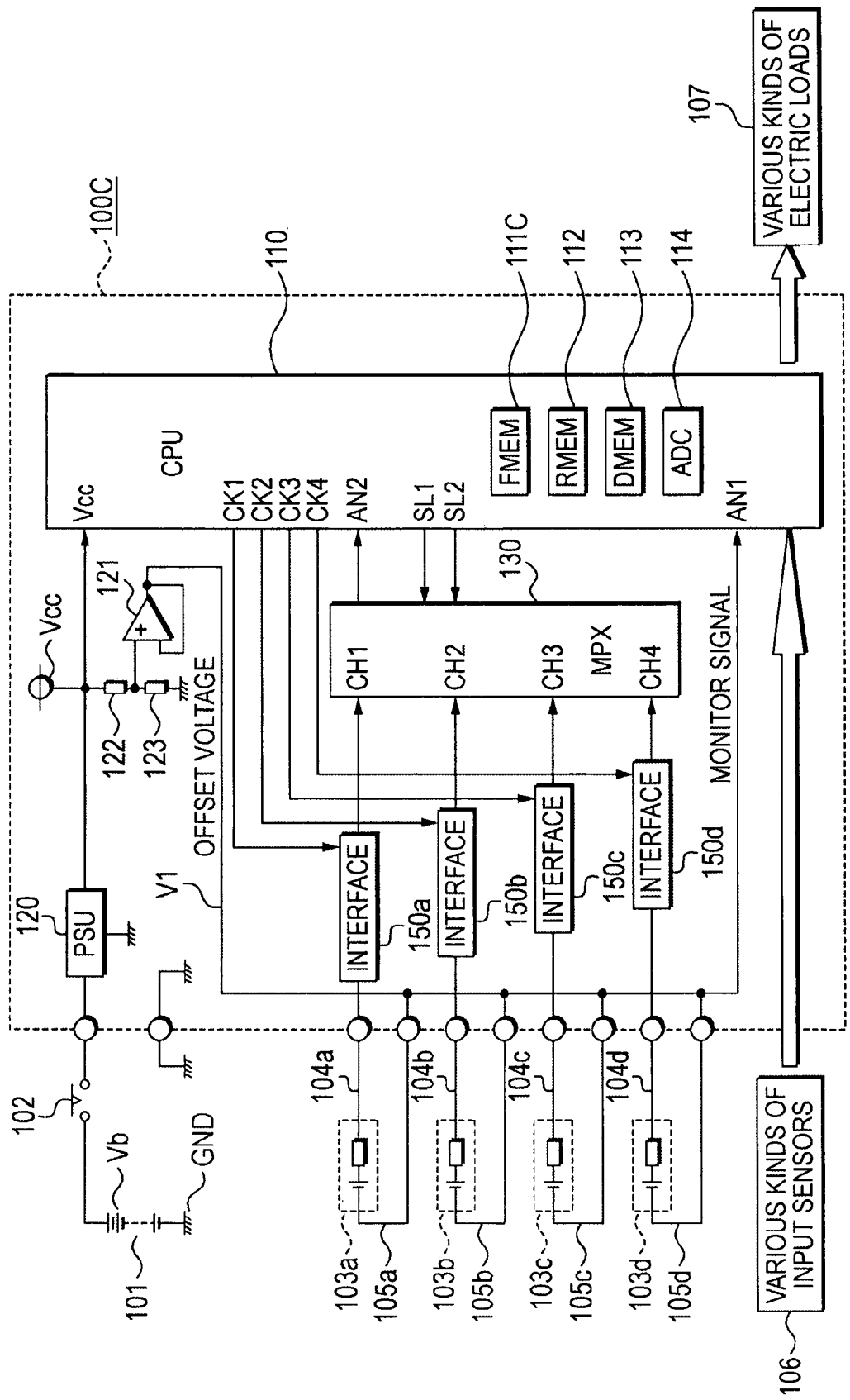
FIG. 9 is a circuit block diagram of a third embodiment device of this invention.

FIG. 9 showing a circuit block diagram of a third embodiment device of this invention will next be explained with points different from those of FIG. 1 as a center.

FIG. 9 differs from FIG. 1 in the contents of interface circuits with respect to exhaust gas sensors 103a to 103d, and addition of a sensor resistance measuring means for detecting a short circuit abnormality is a main different point. The same or corresponding portions are designated by the same reference numerals as FIG. 1.

In FIG. 9, similar to FIG. 1, a vehicle mounting battery 101, an output contact 102 of an electric power source relay, plural exhaust gas sensors 103a to 103d, various kinds of input sensors 106 and various kinds of electric loads 107 are connected to an engine controller 100C.

As the internal construction of the engine controller 100C, similar to FIG. 1, a microprocessor 110 is mutually bus-connected so as to be cooperated with a program memory 111C as e.g., a nonvolatile flash memory, a RAM memory 112 for arithmetic processing, a data memory 113 as e.g., a nonvolatile EEPROM memory, and a multi-channel AD converter 114.

Figure 10:
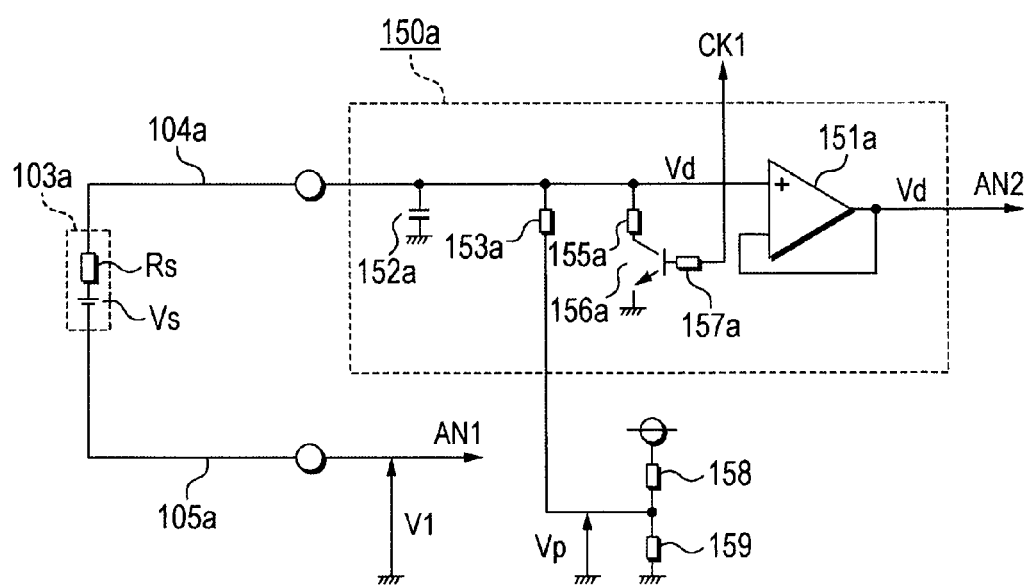
FIG. 10 is a detailed circuit diagram of an interface circuit section of FIG. 9.
Figure 11:
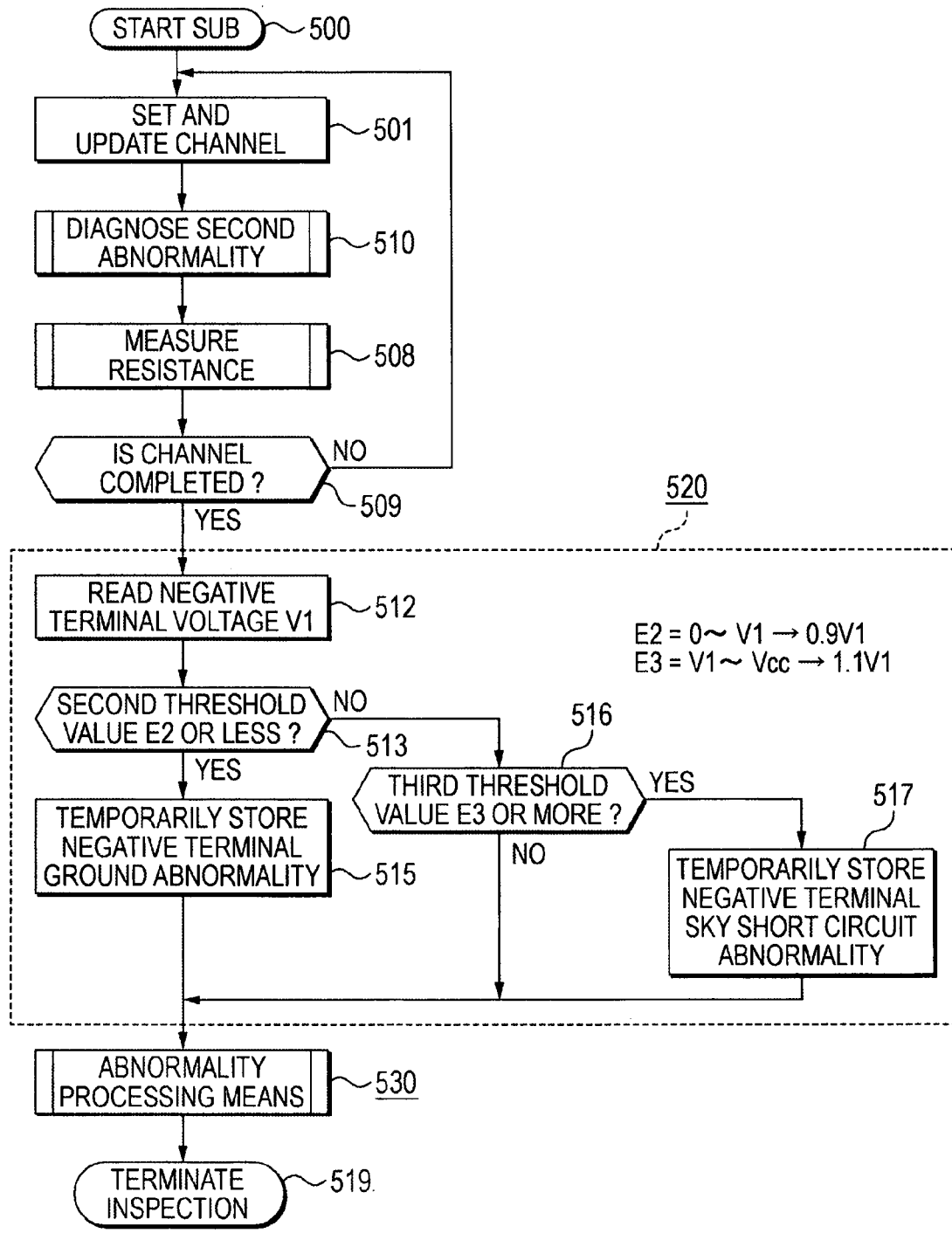
FIG. 11 is a flow chart for explaining an inspecting operation of FIG. 9.
Figure 12:
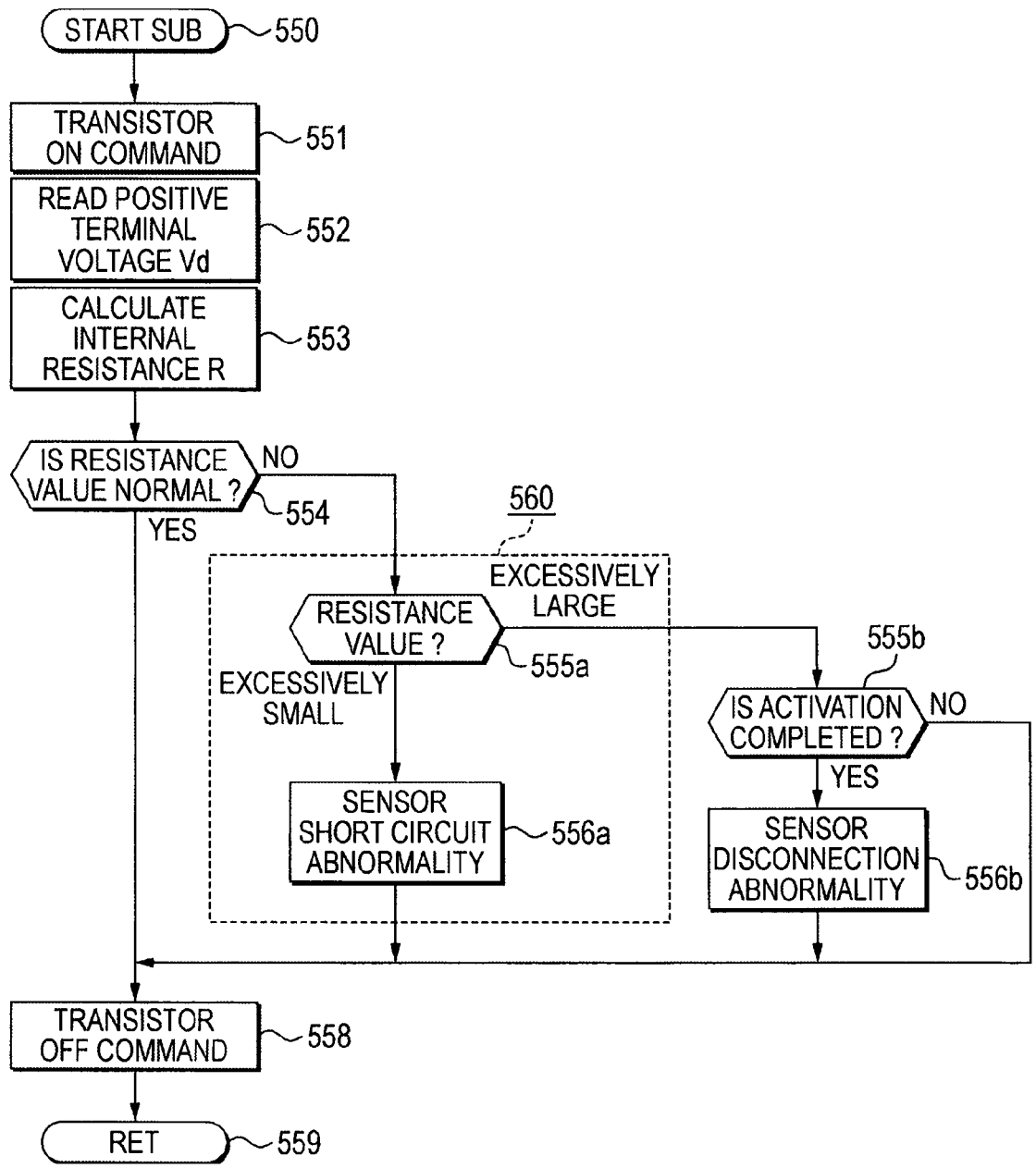
FIG. 12 is a flow chart for explaining an operation relative to a resistance measuring means in FIG. 11.

A program as various kinds of abnormality diagnosing means and abnormality processing means described later in FIGS. 11 and 12 is stored to the program memory 111C in addition to an input-output control program as the engine controller 100C. A constant voltage electric power source circuit 120, voltage dividing resistors 122, 123 and an offset voltage generating circuit 121 are constructed similarly to those of FIG. 1. However, interface circuits 150a to 150d described later in FIG. 10 are used instead of interface circuits 140a to 140d, and the microprocessor 110 generates inspecting commands CK1 to CK4 and controls the operations of the interface circuits 150a to 150d.

In FIG. 10 as a detailed circuit diagram of an interface circuit section of FIG. 9, the interface circuit 105a connected to positive wiring 104a of the exhaust gas sensor 103a has an arithmetic amplifier 151a, a smooth capacitor 152a connected to a non-inverting input terminal of the arithmetic amplifier 151a, a bias resistor 153a, and a voltage dividing resistor 155a. An output terminal of the arithmetic amplifier 151a is negative-feedback-connected to its inverting input terminal, and is selectively connected to an analog input port AN2 of the microprocessor 110 through a multiplexer 130. The voltage dividing resistor 155a is connected to a ground circuit by a series opening-closing element 156a as an NPN type transistor. This series opening-closing element 156a is opened and closed by a driving resistor 157a connected to an inspecting command output CK1 of the microprocessor 110. Voltage dividing resistors 158, 159 of low resistance partially divide an output voltage of the constant voltage electric power source circuit 120, and generate a bias voltage Vp. The bias voltage Vp using the voltage dividing resistors 158, 159 is applied to one end of the bias resistor 153a. The interface circuits 150b to 150d are also similarly constructed, and the offset voltage V1 is applied to negative wirings 105a to 105d.

A measuring voltage Vd as an output voltage of the arithmetic amplifier 151a constructed in this way is shown by the following formula. In this formula, Vcc is a control electric power source voltage, and Rs is an equivalent internal resistance of the exhaust gas sensor 103a, and Vs is a generating voltage of the exhaust gas sensor 103a. V1 is an offset voltage, and R153 is a resistance value of the bias resistor 153a, and R155 is a resistance value of the voltage dividing resistor 155a. It is supposed that the relation of R153>>R155≅Rs is formed.

First, when the measuring voltage Vd at an opening time of the series opening-closing element 156a is set to Voff, the following formula (3) is formed.

$$Voff \cong Vs+(V1+\Delta V2) \text{ Here, } \Delta V2=Vp \times Rs/R153 \quad (3)$$

Next, when the measuring voltage Vd at a closing time of the series opening-closing element 156a is set to Von, the following formula (4) is formed.

$$Von \cong [Vs+(V1+\Delta V2)] \times R155/(Rs+R155) \quad (4)$$

When the ratio of formulas (3) and (4) is calculated, the following formula (5) is obtained.

$$Voff/Von \cong (Rs+R155)/R155 = 1+Rs/R155 \quad (5)$$

When formula (5) is deformed, the internal resistor Rs is calculated by formula (6).

$$Rs=(Voff/Von-1) \times R155 \quad (6)$$

When V1=0.5V, Vs=0 to 1.0V, Vcc=5.0V, Rs=20 KΩ, R153=1000 KΩ, R155=20 KΩ and Vp=0.22V are set as one example, $\Delta V2=Vp(Rs/R153)=0.004V$ is formed.

(2) Detailed Explanation of Action and Operation

The action and operation of the third embodiment device of this invention constructed as shown in FIGS. 9 and 10 will next be explained on the basis of the flow charts shown in FIGS. 11 and 12.

First, in the construction shown in FIGS. 9 and 10, when the output contact 102 is closed, electricity is supplied from the constant voltage electric power source circuit 120 to the microprocessor 110, and the microprocessor 110 starts an operation. Driving control with respect to various kinds of electric loads 107 is executed in accordance with operating states and signal levels of various kinds of input sensors 106 and the exhaust gas sensors 103a to 103d, and the contents of an input-output control program stored to the program memory 111C. In its executing process, an abnormality inspecting operation shown in FIGS. 11 and 12 is performed.

Next, in FIG. 11 as a flow chart for explaining the inspecting operation shown in FIGS. 9 and 10, process 500 is a step for starting the inspecting operation by the microprocessor 110. This starting step is again repeatedly executed at the interval of a predetermined standby time subsequently to an operation terminating step shown in process 519 described later.

Subsequent process 501 is a step for designating a channel number of the multiplexer 130, and setting which one among the exhaust gas sensors 103a to 103d a sensor desirous to be inspected is. Subsequent process block 510 is a step for executing a subroutine program as the above second abnormality diagnosing means described in FIG. 4. In this process block 510, the existence of ground, sky short circuit and disconnection abnormalities relative to positive terminal wiring of the exhaust gas sensor designated in process 501 is judged.

Subsequent process block 508 is a subroutine program as a sensor resistance measuring means described in detail in FIG. 12. The existence of an internal short circuit abnormality of the exhaust gas sensor, or a short circuit abnormality between the positive terminal wiring and the negative terminal wiring is judged by this process block 508.

Subsequent process 509 is a judging step for judging whether all inspecting operations of the plural exhaust gas sensors 103a to 103d are completed. If all the inspecting operations are not completed, it is returned to process 501, and the inspecting operations of the remaining exhaust gas sensors are continued in the judging step. In contrast to this, if all the inspecting operations are completed, it proceeds to process 512 in the judging step.

Process block 520 constructed by a series of processes 512 to 517 subsequent to process 509 expresses the contents of a program as a first abnormality diagnosing means. In this process block 520, the existence of ground and sky short circuit abnormalities relative to the negative terminal wiring of the exhaust gas sensors 103a to 103d is judged.

First, process 512 executed subsequently to process 509 is a step in which a digital converting value D1 of the value of the offset voltage V1 inputted to the analog input port AN1 of the microprocessor 110 and digitally converted by the multi-channel AD converter 114 is read to a first address of the RAM memory 112.

Subsequent process 513 is a judging step for comparing the large and small relation of the digital converting value D1 read in process 512 and a second threshold value E2. If D1≦E2, the judgment of YES is made and it proceeds to process 515 in the judging step. In contrast to this, if D1>E2, the judgment of NO is made and it proceeds to process 516 in the judging step.

A value of a 90% level as a value reliably smaller than the digital converting value D1 (e.g., 100) of the normal offset voltage V1 (e.g., 0.5V) is used as the value of the second threshold value E2. If it is the normal state, no judgment of YES is made in process 513.

Process 516 is a judging step for comparing the large and small relation of the digital converting value D1 read in process 512 and a third threshold value E3. If D1<E3, the judgment of NO is made and it proceeds to process 530 in the judging step. In contrast to this, if E3≦D1, the judgment of YES is made and it proceeds to process 517 in the judging step.

A value of a 110% level as a value reliably greater than the digital converting value D1 (e.g., 100) of the normal offset voltage V1 (e.g., 0.5V) is used as the value of the third threshold value E3. If it is the normal state, no judgment of YES is made in process 516.

Further, process 515 is a step for temporarily storing a negative terminal ground abnormality. Process 517 is a step for temporarily storing a negative terminal sky short circuit abnormality. However, a temporarily stored abnormal state is reconfirmed and is then decided and stored as described later.

Process block 530 is a subroutine program as an abnormality processing means executed when the judgment of NO is made in process 516, or subsequently to processes 515, 517. In this process block 530, as described before in FIG. 5, processings such as judgment confirmation of an abnormal state, abnormality annunciation, storage of abnormality hysteresis information, etc. are executed, and it subsequently proceeds to process 519 as an inspection terminating step. Accordingly, in this embodiment mode, a positive terminal abnormality and a short circuit abnormality of all the exhaust gas sensors are inspected by a flow of one cycle from process 501 to process block 508. Thereafter, a negative terminal abnormality is inspected by process block 520. Subsequently, abnormality processing using process block 530 is executed so that a control flow of one cycle is terminated. Subsequently, operation starting process 500 is activated.

Process block 520 may be also executed before processes 501 to 509.

In FIG. 12 as a flow chart for explaining an operation relative to a sensor resistance measuring means in FIG. 11, process 550 is an operation starting step of the sensor resistance measuring means. This process 550 is constructed so as to be executed subsequently to process block 510 of FIG. 11, and be returned to process 509 subsequently to process 559 described later. The process block constructed by a series of processes 551 to 558 subsequent to process 550 expresses the contents of process block 508 in FIG. 11.

First, in process 551 executed subsequently to process 550, the microprocessor 110 closes a series opening-closing element 156a by an inspecting command output CK1.

Subsequent process 552 is a step in which a digital converting value D2 of the value of the measuring voltage Vd inputted to the analog input port AN2 of the microprocessor 110 and digitally converted by the multi-channel AD converter 114 is read to a third address of the RAM memory 112 as the value of the closing voltage Von. When process block 510 is executed, the digital converting value D2 of the value of the measuring voltage Vd is read and stored to a second address of the RAM memory 112 as the value of the opening voltage Voff by process 311 of FIG. 4.

Subsequent process 553 is a step for calculating the equivalent internal resistance Rs of the exhaust gas sensor by formula (6) on the basis of the value of the closing voltage Von read and stored in process 552, and the value of the opening voltage Voff read and stored within process block 510.

Subsequent process 554 is a judging step for judging whether the internal resistance Rs calculated in process 553 is close to a predetermined normal value. When the internal resistance Rs is approximately equal to a normal value, the judgment of YES is made and it proceeds to process 558 in the judging step. In contrast to this, when the internal resistance Rs is separated from the normal value, it proceeds to process 555a in the judging step.

Process 555a is a judging step in which it proceeds to process 556a if the internal resistance Rs calculated in process 553 is excessively small with respect to the normal value. In contrast to this, if the internal resistance Rs is excessively large, it proceeds to process 555b in the judging step.

Process 555b is a judging step for judging whether a warming-up operation of e.g., several minutes is completed. If the warming-up operation is completed, it proceeds to process 556b in the judging step. In contrast to this, if no warming-up operation is completed, it proceeds to process 558 in the judging step. Process 556a is a step for judging a short circuit abnormality of a sensor or wiring, and temporarily storing this short circuit abnormality judgment to the RAM memory 112. Process 556b is a step for judging a disconnection abnormality or the sensor or the wiring, and temporarily storing this disconnection abnormality judgment to the RAM memory 112.

In process 558 executed when the judgment of YES is made in process 554, or the judgment of NO is made in process 555b, or subsequently to processes 556a, 556b, the series opening-closing element 156a closed in process 551 is opened, and it subsequently proceeds to process 509 of FIG. 11 via returning process 559.

Process block 560 constructed by processes 555a and 556a becomes a short circuit abnormality judging means. The normal value of the internal resistance Rs of the exhaust gas sensor is stored and preserved to the program memory 111C in advance. However, the value of the internal resistance Rs calculated in process 553 is sequentially averaged, and can be also used as the normal value of the internal resistance of a present product mounted and used.

Further, when the value of an operating initial period of an engine is stored as an initial value with respect to the internal resistance Rs learned and memorized in this way and the internal resistance Rs of the present time point is greatly changed from this initial value, this change can be also judged as a deterioration abnormality of the exhaust gas sensor.

(3) Main Point and Feature of Embodiment Mode 3

The engine controller 100C in embodiment mode 3 of this invention is an engine controller having the microprocessor 110 for operating and controlling various kinds of electric loads 107 for operating the above internal combustion engine in accordance with operating states of various kinds of input sensors 106 for monitoring an operating state of the internal combustion engine, and the contents of a control program stored to the program memory 111C.

The above various kinds of input sensors 106 include plural exhaust gas sensors 103a to 103d. A predetermined offset voltage V1 generated by the offset voltage generating circuit 121 is applied to each of the negative terminals of the above plural exhaust gas sensors 103a to 103d. A negative terminal electric potential as the voltage between this negative terminal and the ground circuit GND is digitally converted through the multi-channel AD converter 114, and is stored to the RAM memory 112 for arithmetic processing through the above microprocessor 110.

The above program memory 111C includes at least a program as the first and second abnormality diagnosing means 520, 510, and a program as the positive terminal abnormality judgment avoiding means 330b.

A bias adding resistor is connected to each of the positive terminals of the above plural exhaust gas sensors 103a to 103d. The above program memory 111C includes a program as a third abnormality diagnosing means 330a.

The above bias adding resistor is constructed by the bias resistor 153a (to 153d) of high resistance. This bias resistor 153a (to 153d) is connected to an input circuit of the arithmetic amplifier 151a (to 151d) connected to each of the positive terminal wirings 104a to 104d of the above exhaust gas sensors 103a to 103d. The bias resistor 153a (to 153d) is also connected between the bias voltage Vp obtained by partially dividing the output voltage of the constant voltage electric power source circuit 120 and an input terminal of the above arithmetic amplifier 151a (to 151d).

The above bias voltage Vp is set so as to be a value smaller than the above offset voltage V1, or become a value greater than the adding value V1+Vm of the above offset voltage V1 and the maximum detecting voltage Vm.

The above third abnormality diagnosing means 330a is a means for judging that it is a disconnection abnormality of a sensor circuit when the digital converting value D2 of the above positive terminal electric potential corresponds to a digital converting value of the bias voltage Vp added by the above bias resistor 153a (to 153d). The above third abnormality diagnosing means 330a is set to become valid after a time presumed as activation of the above exhaust gas sensors 103a to 103d has passed after a predetermined time of an operation start.

Accordingly, since the sky short circuit and ground abnormalities and the disconnection abnormality can be discriminated and detected, there is a feature in which efficiency of maintenance inspection is improved.

A series circuit of the series opening-closing element 156a (to 156d) and the voltage dividing resistor 155a (to 155d) connected to the ground circuit is connected to the positive terminals of the above exhaust gas sensors 103a to 103d. The above program memory 111C further includes a program as a sensor resistance measuring means 508, and a program as a short circuit abnormality judging means 560.

The above sensor resistance measuring means 508 becomes a means for calculating the internal resistance Rs of the above exhaust gas sensors 103a to 103d by comparing a positive terminal electric potential Von provided when the above series opening-closing element 156a (to 156d) is temporarily closed, and a positive terminal electric potential Voff provided just before the above series opening-closing element 156a (to 156d) is closed, or provided just after the above series opening-closing element 156a (to 156d) is again opened.

The above short circuit abnormality judging means 560 becomes a means in which the internal resistance Rs of the exhaust gas sensors 103a to 103d measured by the above sensor resistance measuring means 508 is a predetermined threshold value or less so that it is judged as a short circuit abnormality between the positive and negative terminals of the above exhaust gas sensors 103a to 103d.

Accordingly, there are features in which it is avoided that the short circuit abnormality of the exhaust gas sensor itself, or the short circuit abnormality between the positive wiring and the negative wiring is detected, and a control state becomes abnormal, and efficiency of maintenance inspection can be improved.

The above series opening-closing element 156a (to 156d) is operated in association with selective designation of one of the plural exhaust gas sensors 103a to 103d using the above multiplexer 130. If the above series opening-closing element 156a (to 156d) is closed at a selective designating time of the previous time, the operation of the above series opening-closing element 156a (to 156d) is synchronously controlled so as to be opened at the selective designating time of the present time.

Accordingly, there is a feature in which the internal resistance can be measured without increasing a selecting stage number using the multiplexer and an analog input point number of the multi-channel AD converter.

Various modifications and alterations of this invention will be apparent to those skilled in the art without departing from the scope and spirit of this invention, and it should be understood that this is not limited to the illustrative embodiments set forth herein.

What is claimed is:

1. An engine controller having a microprocessor for controlling and operating various kinds of electric loads for operating an internal combustion engine in accordance with operating states of various kinds of input sensors for monitoring an operating state of said internal combustion engine, and the contents of a control program stored to a program memory;

wherein said various kinds of input sensors include plural exhaust gas sensors;

each of the exhaust gas sensors has an equivalent voltage source and an equivalent internal resistor connected between a pair of positive and negative terminals;

a generating voltage Vs of said equivalent voltage source is changed from a minimum value V0 to a maximum value Vm with a theoretical air fuel ratio as a boundary at a predetermined activating temperature;

a predetermined offset voltage V1 generated by an offset voltage generating circuit is applied to each of the negative terminals of said plural exhaust gas sensors;

a negative terminal electric potential as a voltage between the negative terminal and a ground circuit is digitally converted through a multi-channel AD converter, and is stored to a RAM memory for arithmetic processing through said microprocessor;

at least one of a pull-down resistor and a pull-up resistor of high resistance connected to the ground circuit, and a bias resistor of high resistance for giving a predetermined bias electric potential is connected to each of the positive terminals of said plural exhaust gas sensors;

a positive terminal electric potential as a voltage between the positive terminal and the ground circuit is respectively converted individually digitally through the multi-channel AD converter, and is stored to said RAM memory for arithmetic processing through said microprocessor;

said program memory includes at least a program as first and second abnormality diagnosing means, and a program as a positive terminal abnormality judgment avoiding means;

said first abnormality diagnosing means is a means for judging that it is a sky short circuit abnormality for making negative terminal wirings come in mixing contact with an electric power source line, or a ground abnormality for making the negative terminal wirings come in mixing contact with a ground line according to whether a digital converting value D1 of said negative terminal electric potential is excessively large or excessively small with a value proportional to said offset voltage V1 as a reference;

said second abnormality diagnosing means is a means for judging that it is a sky short circuit abnormality for making positive terminal wirings come in mixing contact with the electric power source line, or a ground abnormality for making the positive terminal wirings come in mixing contact with the ground line according to whether a digital converting value D2 of said positive terminal electric potential is excessively large with a value proportional to an adding value V1+Vm of said offset voltage V1 and a maximum detecting voltage Vm as a reference, or is excessively small with the value proportional to said offset voltage V1 as a reference; and said second abnormality diagnosing means judges a disconnection abnormality as said ground abnormality or the sky short circuit abnormality when the disconnection abnormality is generated;

said microprocessor obtains a digital converting value proportional to a generating voltage Vs of said exhaust gas sensor by a differential arithmetic calculation of the digital converting value D2 of said positive terminal electric potential and the digital converting value D1 of the negative terminal electric potential, and performs abnormality annunciation according to a diagnosing result using said first and second abnormality diagnosing means; and said positive terminal abnormality judgment avoiding means is a means for judging no ground abnormality of the positive terminal wirings using said second abnormality diagnosing means and considering the differential arithmetic calculation of said microprocessor to be valid when said first abnormality diagnosing means detects the ground abnormality of at least the negative terminal wiring.

2. The engine controller according to claim 1, wherein a bias adding resistor is connected to each of the positive terminals of said plural exhaust gas sensors;

said program memory includes a program as a third abnormality diagnosing means;

said bias adding resistor is constructed so as to apply a predetermined bias voltage Vp by combining a pair of pull-up resistor and pull-down resistor connected to an input circuit of the arithmetic amplifier connected to each of the positive terminal wirings of the above exhaust gas sensors, or is constructed by a bias resistor of high resistance connected between a bias voltage Vp obtained by partially dividing the output voltage of a constant voltage electric power source circuit and an input terminal of said arithmetic amplifier, and said bias voltage Vp is set so as to become a value smaller than the above offset voltage V1, or a value greater than the adding value V1+Vm of the above offset voltage V1 and the maximum detecting voltage Vm;

said third abnormality diagnosing means is a means for judging that it is a disconnection abnormality of a sensor circuit when the digital converting value D2 of said positive terminal electric potential corresponds to a digital converting value of the bias voltage Vp added by said pull-down resistor and the pull-up resistor or the bias resistor; and said third abnormality diagnosing means becomes valid after a time presumed as activation of said exhaust gas sensor has passed after a predetermined time from an operation start.

3. The engine controller according to claim 2, wherein said program memory further includes a program as a judgment confirming means and an abnormality processing means;

said judgment confirming means is operated when said first, second and third abnormality diagnosing means detects the existence of an abnormality, and reconfirms an abnormal state of the exhaust gas sensor judged as the abnormality, and neglects a judging result as a temporary erroneous judgment when no abnormality generation is confirmed; and said abnormality processing means is executed when said judgment confirming means reconfirms the abnormal state, and warns and displays an abnormality generating state, and stores and preserves the abnormality generating state to a nonvolatile data memory as abnormality generating hysteresis information.

4. The engine controller according to claim 1, wherein the positive terminals of said plural exhaust gas sensors are individually connected to said engine controller by individual positive wirings;

the negative terminal of a first exhaust gas sensor among said plural exhaust gas sensors is connected to said engine controller by first negative wiring;

the negative terminals of the other exhaust gas sensors are mutually sequentially connected by transition wirings;

the negative terminal of the final exhaust gas sensor is connected to said engine controller by second negative wiring; and said first and second negative wirings are connected within said engine controller, and constitute a loop circuit, and are connected to the common offset voltage generating circuit, and the predetermined offset voltage V1 is applied.

5. The engine controller according to claim 4, wherein said first and second negative wirings are connected through an opening-closing element for inspection within said engine controller;

an output voltage of said offset voltage generating circuit is supplied to an analog input terminal of said multi-channel AD converter as a monitor signal voltage through said opening-closing element for inspection;

at least one of a second pull-down resistor connected to the ground circuit, and a second pull-up resistor connected to an output terminal of the constant voltage electric power source circuit are connected to an input circuit with respect to the analog input terminal;

said program memory further includes a control program as a negative line disconnection abnormality detecting means;

said negative line disconnection abnormality detecting means is a means for comparing the value of said monitor signal voltage and said offset voltage V1 when said opening-closing element for inspection is temporarily opened; and said negative line disconnection abnormality detecting means is also a means for detecting the existence of the ground abnormality, the sky short circuit abnormality and the disconnection abnormality of wiring from said offset voltage generating circuit to said multi-channel AD converter via the first negative wiring, the transition wirings and the second negative wiring.

6. The engine controller according to claim 1, wherein the electric potential of each of the positive terminals of said plural exhaust gas sensors is selectively supplied to one analog input terminal of said multi-channel AD converter through the multiplexer;

an output voltage of said offset voltage generating circuit commonly connected to each of the negative terminals of said plural exhaust gas sensors is supplied to another input terminal of said multi-channel AD converter; and said multiplexer selectively supplies an analog input signal by a selecting command from said microprocessor.

7. The engine controller according to claim 1, wherein a series circuit of a series opening-closing element and a voltage dividing resistor connected to the ground circuit is connected to the positive terminal of said exhaust gas sensor;

said program memory further includes a program as a sensor resistance measuring means and a program as a short circuit abnormality judging means;

said sensor resistance measuring means is a means for calculating internal resistance of said exhaust gas sensor by comparing a positive terminal electric potential Von provided when said series opening-closing element is temporarily closed, and a positive terminal electric potential Voff provided just before said series opening-closing element is closed, or just after said series opening-closing element is again opened; and said short circuit abnormality judging means is a means for judging that it is a short circuit abnormality between the positive and negative terminals of said exhaust gas sensor when the internal resistance of the exhaust gas sensor measured by said sensor resistance measuring means is a predetermined threshold value or less.

8. The engine controller according to claim 7, wherein said series opening-closing element is operated in association with selective designation of one of the plural exhaust gas sensors using said multiplexer, and is synchronously controlled so as to be opened at a selective designating time of this time if said series opening-closing element is closed at the selective designating time of the previous time.

* * * * *